US011169631B2

United States Patent
Li et al.

(10) Patent No.: US 11,169,631 B2
(45) Date of Patent: Nov. 9, 2021

(54) ORGANIC LIGHT EMITTING DIODE TOUCH DISPLAY PANEL AND METHOD FOR DRIVING TIME DIVISION MULTIPLEXING

(71) Applicant: WUHAN CHINA STAR OPTOELECTRONICS SEMICONDUCTOR DISPLAY TECHNOLOGY CO., LTD., Wuhan (CN)

(72) Inventors: Wenqi Li, Wuhan (CN); Caiqin Chen, Wuhan (CN)

( * ) Notice: Subject to any disclaimer, the term of this patent is extended or adjusted under 35 U.S.C. 154(b) by 281 days.

(21) Appl. No.: 16/470,246

(22) PCT Filed: Apr. 15, 2019

(86) PCT No.: PCT/CN2019/082707
§ 371 (c)(1),
(2) Date: Jun. 17, 2019

(87) PCT Pub. No.: WO2020/155402
PCT Pub. Date: Aug. 6, 2020

(65) Prior Publication Data
US 2021/0181878 A1    Jun. 17, 2021

(30) Foreign Application Priority Data

Jan. 30, 2019   (CN) .......................... 201910094258.5

(51) Int. Cl.
*G06F 3/041* (2006.01)
*G06F 3/044* (2006.01)
(Continued)

(52) U.S. Cl.
CPC .......... *G06F 3/0412* (2013.01); *G06F 3/0446* (2019.05); *G06F 3/04164* (2019.05);
(Continued)

(58) Field of Classification Search
CPC .. G06F 3/0412; G06F 3/04166; G06F 3/0446; G06F 3/04164; G06F 2203/04102;
(Continued)

(56) References Cited

U.S. PATENT DOCUMENTS

2015/0378390 A1* 12/2015 Liu ....................... G06F 3/0443
345/173
2017/0269745 A1* 9/2017 Ding ................... H01L 51/5221
(Continued)

FOREIGN PATENT DOCUMENTS

CN    105493013 A    4/2016
CN    107452781 A    12/2017
(Continued)

*Primary Examiner* — Towfiq Elahi

(57) ABSTRACT

An organic light emitting diode touch display panel and a method for driving time division multiplexing are disclosed. The OLED touch display panel with a patterned cathode uses a pixel definition layer of a LTPS array substrate to form sensor pads. By adding a time division multiplexing circuit unit to each voltage signal traces outside the display area of the touch display panel, the power signal traces of the source and drain layer of the LTPS array substrate are multiplexed, and peeling during the flexible screen bending process can be prevented.

18 Claims, 18 Drawing Sheets

(51) Int. Cl.
*G09G 3/3225* (2016.01)
*G09G 3/00* (2006.01)
*H01L 27/32* (2006.01)

(52) U.S. Cl.
CPC ....... *G06F 3/04166* (2019.05); *G09G 3/3225* (2013.01); *G06F 2203/04102* (2013.01); *G09G 3/035* (2020.08); *H01L 27/323* (2013.01); *H01L 27/3276* (2013.01); *H01L 2251/5338* (2013.01)

(58) Field of Classification Search
CPC .... G09G 3/3225; G09G 3/035; H01L 27/323; H01L 27/3276; H01L 2251/5338
See application file for complete search history.

(56) References Cited

U.S. PATENT DOCUMENTS

| | | | |
|---|---|---|---|
| 2019/0042044 A1 | 2/2019 | Zhao et al. | |
| 2019/0369768 A1 | 12/2019 | Chen | |

FOREIGN PATENT DOCUMENTS

| | | | |
|---|---|---|---|
| CN | 108807715 A | 11/2018 | |
| KR | 101365779 B1 | 2/2014 | |

\* cited by examiner

ORGANIC LIGHT EMITTING DIODE TOUCH DISPLAY PANEL AND METHOD FOR DRIVING TIME DIVISION MULTIPLEXING

FIELD OF INVENTION

This invention relates to the field of display technologies, and, in particular, to an organic light emitting diode touch display panel and a method for driving time division multiplexing.

BACKGROUND OF INVENTION

Organic light emitting diode (OLED) display technology has developed rapidly in recent years, and makes flexible display touch products with curved surfaces enter the market quickly. The technology in related fields also has changed with rapid progress. OLEDs are diodes which use organic semiconductor material and luminescent material in an electric field to perform carrier injection and recombination to emit light.

Active-matrix organic light emitting diode (AMOLED) originates from OLED display technology, and the AMOLED has self-luminous properties. The AMOLED uses very thin organic material coatings and glass substrates, and when current passes, these organic material coatings will emit light. Unlike TFT-LCD which requires a backlight, the AMOLED panel is self-illuminating, so the AMOLED panel has a wide viewing angle and high color saturation. In particular, due to its low driving voltage and low power consumption, fast response, light weight, thin thickness, simple structure and low cost, the AMOLED panel are regarded as one of the most promising products.

With development of portable electronic display devices, a new human-machine interface for touch technology is provided, which is more direct and more user-friendly to use. The touch technology and the flat display technology are integrated to form a touch display device, so that the flat device incorporates a touch function, and user can input by fingers or stylus intuitively. With regard to OLED touch display panels, an add-on type and an on-cell type panels are common structures.

As demand for flexible AMOLED or AMOLED with a folding screen increases, a touch sensor is attached to the AMOLED. Because a touch panel and a touch IC cannot be integrated into a driving chip, the cost of the AMOLED increases. The more important is various problems such as peeling may occur during bending process. Therefore, it is necessary to improve the process, develop a low-temperature CVD, PVD process, and coat directly on the AMOLED to make an on-cell type touch display panel. However, since the OLED luminescent material is sensitive to temperature (it will be invalid at about 80° C.), making an on-cell type touch display panel is very difficult.

Referring to FIG. 1, FIG. 2A-2B, and FIG. 3-4, FIG. 1 is a structural diagram of an AMOLED touch display panel in the prior art, FIG. 2A is a schematic diagram of a shape of mutual-capacitance sensor pads in the prior art, FIG. 2B is a schematic diagram of a shape of the self-capacitance sensor pads in the prior art, FIG. 3 is a driving timing diagram of the mutual capacitance and the self-capacitance in the prior art, and FIG. 4 is a schematic diagram of the layout of the voltage signal traces in the prior art. in FIG. 2A, the mutual-capacitance sensor pads in a transverse direction are driving signal (TX) traces 211, and the mutual-capacitance sensor pads in a longitudinal direction are sensing signal (RX) traces 212. The self-capacitance sensor pads 221 in FIG. 2B are electrically connected to the touch chip (not shown) through touch signal traces 222. The driving signal (TX1-TXn) electrodes in FIG. 3 are used as pressure transmitters, and sensing signal (RX1) electrodes are as receivers. The layout of the voltage signal traces in FIG. 4 includes the layout of the reset voltage signal (Vi) traces 41 and the power supply voltage signal (VDD) traces 42. Reference numeral 43 denotes an active area, and reference numeral 44 denotes a drive chip IC.

As shown in FIG. 1, the AMOLED touch display panel includes a base substrate 10 (by forming an array circuit layer on a glass substrate to form a base substrate 10, wherein the array circuit layer includes a buffer layer, an active layer, a gate insulating layer, a gate layer, an interlayer insulating layer, and a passivation layer), a flat layer (PLN) 11, a source and drain layer (SD) 12, an anode 13, a pixel defining layer (PDL) 14, a hole injection layer (HIL) 15, a hole transport layer (HTL) 16, an organic light emitting diode layer (OLED) 17, an electron transport layer (ETL) 18, and a cathode 19 provided on the base substrate 10 in this order. The uppermost cathode 19 of the AMOLED touch display panel is fabricated by a common mask evaporation process, the cathode 19 is formed as a whole layer, and it completely shields the electric field lines when a finger touch the screen, so that the electric field cannot reach the structure under the cathode, and thus an in-cell touch structure in which a touch sensor is embedded in a liquid crystal panel cannot be used.

Therefore, how to fabricate an in-cell touch structure of an AMOLED touch display panel with a patterned cathode by low temperature poly-silicon (LTPS), to reduce cost and prevent peeling during the flexible screen bending process is an urgent problem to be solved in the development of touch display panel technology.

SUMMARY OF INVENTION

The object of the present invention is to provide an OLED touch display panel and a method for driving time division multiplexing, which can fabricate an in-line touch structure, reduce cost and reduce peeling in the flexible screen bending process.

To achieve the above objective, the present invention provides an OLED touch display panel, including a source and drain layer and a pixel defining layer (PDL) disposed on an array substrate, and sensor pads embedded in the pixel defining layer; wherein in a display area of the touch display panel, voltage signal traces of the source and drain layer are multiplexed as touch signal traces of the sensor pads, wherein, power voltage signal traces of the voltage signal traces are multiplexed as touch driving signal traces of the touch signal traces, and reset voltage signal traces of the voltage signal traces are multiplexed as touch sensing signal traces of the touch signal traces; or the power voltage signal traces of the voltage signal traces are multiplexed as the touch sensing signal traces of the touch signal traces, and the reset voltage signal traces of the voltage signal traces are multiplexed as the touch driving signal traces of the touch signal traces; or the power voltage signal traces or reset voltage signal traces of the voltage signal traces are multiplexed as the touch signal traces; wherein outside the display area of the touch display panel, each of input ends of the touch signal traces is provided with a time division multiplexing circuit unit; wherein when the touch display panel is in a display period, a display driving module inputs a voltage signal to the touch display panel via the time division multiplexing circuit unit through the voltage signal traces to provide the voltage signal to a pixel circuit of the touch display panel; and wherein when the touch display panel is in a touch period, a touch module inputs a touch driving signal or a touch driving composite signal to the touch display panel via the time division multiplexing circuit unit through the touch signal traces, and the touch module receives a touch sensing signal or a touch sensing composite signal generated by the sensor pads of the touch display panel.

To achieve the above objective, the present invention further provides an OLED touch display panel, including a source and drain layer and a pixel defining layer disposed on an array substrate, and sensor pads embedded in the pixel defining layer; wherein in a display area of the touch display panel, voltage signal traces of the source and drain layer are multiplexed as touch signal traces of the sensor pads; wherein when the touch display panel is in a display period, a display driving module inputs a voltage signal to the touch display panel through the voltage signal traces to provide the voltage signal to a pixel circuit of the touch display panel; and wherein when the touch display panel is in a touch period, a touch module inputs a touch driving signal or a touch driving composite signal to the touch display panel through the touch signal traces, and the touch module receives a touch sensing signal or a touch sensing composite signal generated by the sensor pads of the touch display panel.

To achieve the above objective, the present invention further provides a driving method for an organic light emitting diode touch display panel with time division multiplexing, including when the touch display panel is in a display period, a display driving module inputs a voltage signal to the touch display panel through voltage signal traces in a display area of the touch display panel to provide the voltage signal to a corresponding pixel circuit of the touch display panel; and when the touch display panel is in a touch period, the voltage signal traces are multiplexed as touch signal traces, a touch module inputs a touch driving signal or a touch driving composite signal to the touch display panel through the touch signal traces, and the touch module receives a touch sensing signal or a touch sensing composite signal generated by corresponding sensor pads of the touch display panel.

The OLED touch display panel with a patterned cathode of the present invention uses a pixel definition layer (PDL) of a LTPS array substrate to form sensor pads. By adding a time division multiplexing circuit unit to each voltage signal input trace outside the display area of the touch display panel, the power signal traces of the source and drain layer of the LTPS array substrate are multiplexed, and a specific signal circuit for the mutual capacitance/self capacitance structure of the in-cell touch display panel of the OLED touch display panel is realized. Time-division input and output of a touch signal TX/RX and a voltage signal ViNDD of an in-cell touch display panel are achieved. There is no need to add layers, and the pixel structure does not need to add extra traces, so the pixel space and cost can be reduced, and peeling during the flexible screen bending process can be prevented. The invention is applicable to a touch and display driver integration IC, or to a discrete IC assembly controlled independently by an existing touch IC and a display driver IC.

DESCRIPTION OF DRAWINGS

In order to more clearly illustrate the technical solutions in the embodiments of the present invention, the drawings used in the description of the embodiments will be briefly described below. Obviously, the drawings in the following description are only some embodiments of the present invention, and those skilled in the art can obtain other drawings according to these drawings without any creative work.

DETAILED DESCRIPTION OF PREFERRED EMBODIMENTS

Figure 1:
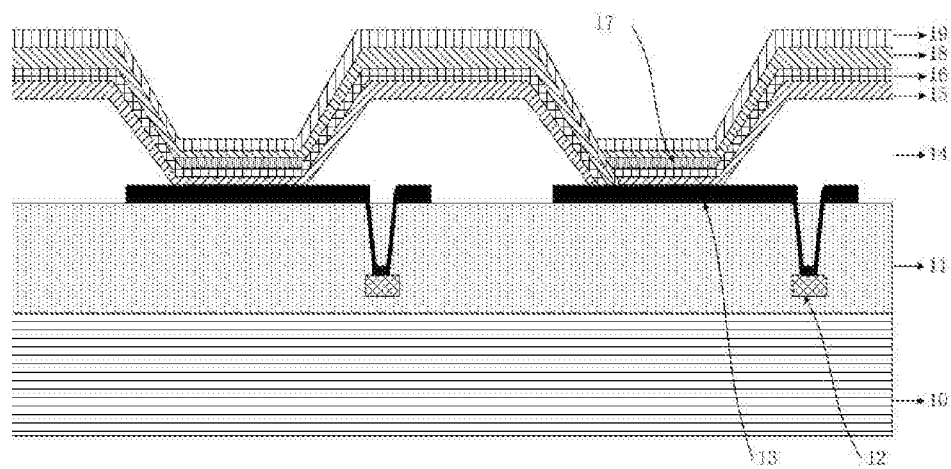
FIG. 1 is a structural diagram of an AMOLED touch display panel in the prior art.
Figure 2A:
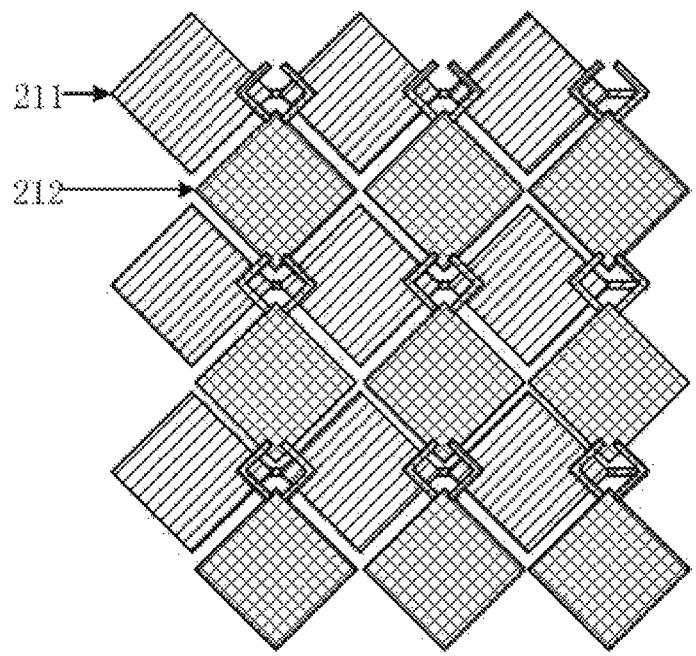
FIG. 2A is a schematic view showing a shape of mutual capacitance sensor pads in the prior art.
Figure 2B:
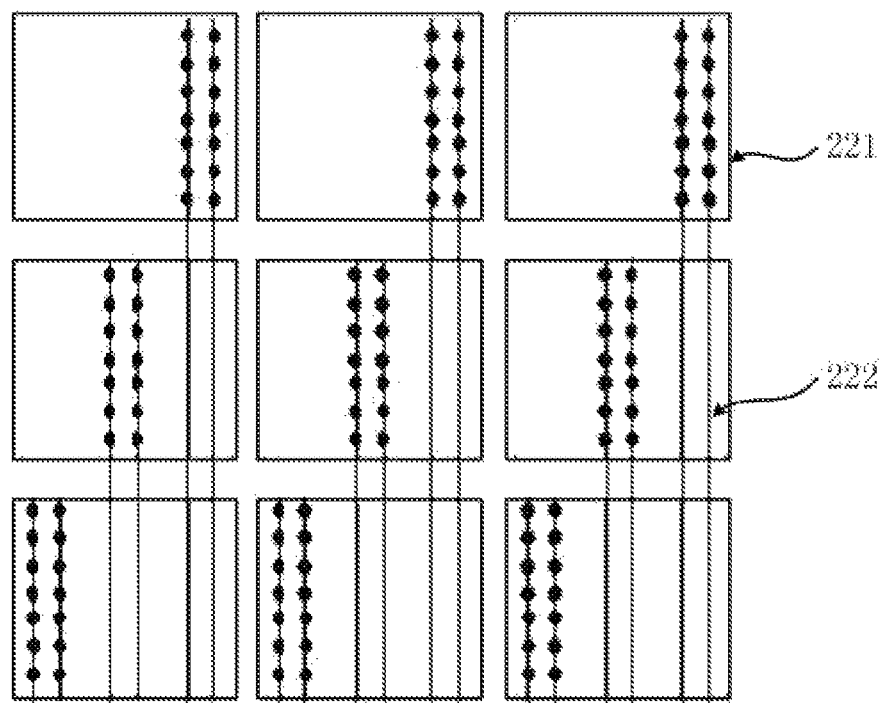
FIG. 2B is a schematic view showing a shape of self-capacitance sensor pads in the prior art.
Figure 3:
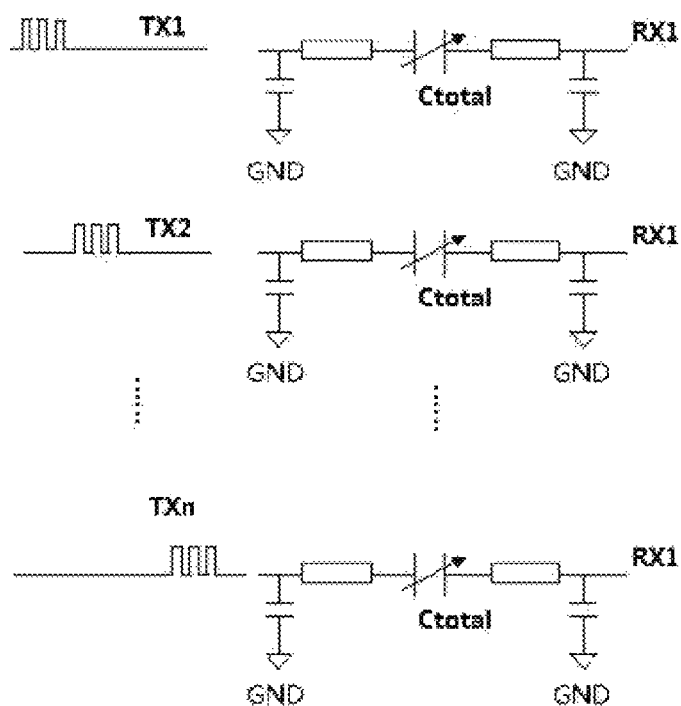
FIG. 3 is a driving sequence diagram of a mutual capacitance and a self capacitance in the prior art.
Figure 4:
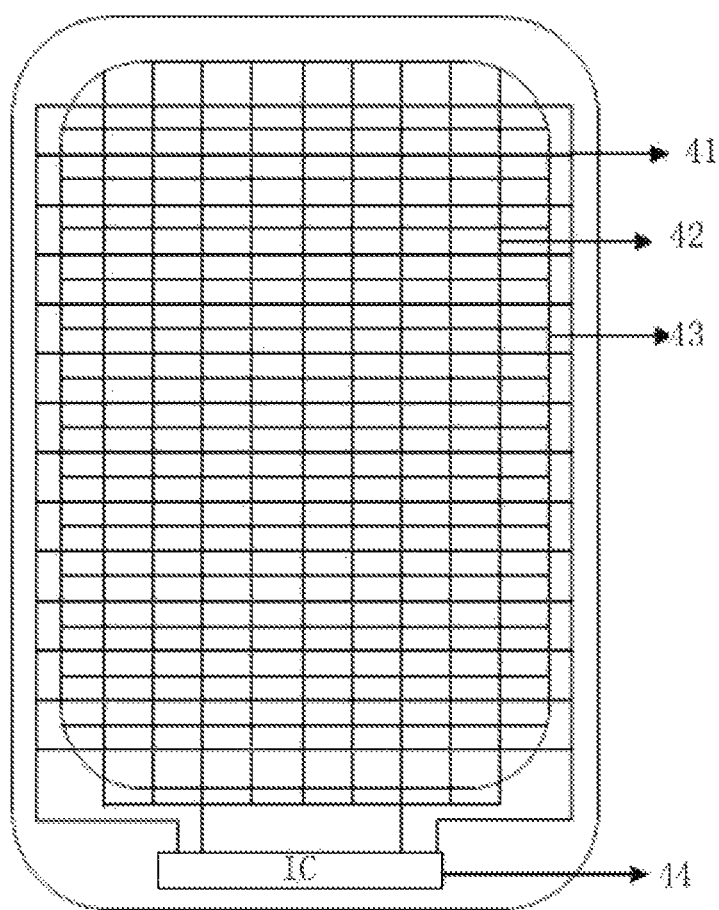
FIG. 4 is a schematic diagram showing the layout of voltage signal traces in the prior art.

The embodiments of the present invention are described in detail below, and the examples of the embodiments are illustrated in the accompanying drawings, wherein the same or similar reference numerals are used to refer to the same or similar elements or elements having the same or similar functions. The embodiments described below are exemplified and are merely illustrative of the invention, and they are not to be construed as limiting the invention.

In the present invention, unless otherwise specifically defined and defined, the first feature "on" or "under" the second feature may include direct contact of the first and second features, and may also include first and second features not in direct contact but through additional feature contact between them. Moreover, the first feature "above" the second feature means the first feature above or over the second feature, or merely indicating that the first feature level is higher than the second feature. The first feature "below" the second feature means the first feature below or under the second feature, or merely indicating that the first feature level is less than the second feature.

The following disclosure provides many different embodiments or examples for implementing different structures of the present invention. Of course, they are merely examples and are not intended to limit the invention. In addition, the present invention may repeat reference numerals and/or reference letters in different examples, which are for the purpose of simplicity and clarity, and they do not indicate the relationship between the various embodiments and/or arrangements. Moreover, the present invention provides examples of various specific processes and materials, but one of ordinary skill in the art will recognize the use of other processes and/or the use of other materials.

The OLED touch display panel of the present invention includes a source and drain layer and a pixel defining layer disposed on the array substrate, and sensor pads embedded in the pixel defining layer. In the display area of the touch display panel, voltage signal traces of the source and drain layer are multiplexed as touch signal traces of the sensor pads. When the touch display panel is in the display period, the display driving module inputs a voltage signal to the touch display panel through the voltage signal traces, and supplies a voltage signal to the pixel circuit of the touch display panel (power supply voltage signal VDD and/or reset voltage signal Vi). When the touch display panel is in the touch period, the touch module inputs a touch driving signal TX or a touch driving composite signal CK-TX to the touch display panel through the touch signal traces, and the touch module receives the touch sensing signal RX or the touch sensing composite signal CK-RX generated by the sensor pads of the touch display panel. The source and the drain layer electrically connect to the display driving module through the voltage signal traces, and the sensor pads electrically connect to the touch module through the touch signal traces.

The method for multiplexing the voltage signal traces of the source and drain layer as the touch signal traces of the sensor pads is adopted in one of the following ways. IF the OLED touch display panel of the present invention is a mutual-capacitance touch display panel, the power voltage signal (VDD) traces of the voltage signal traces are multiplexed as the touch driving signal (TX) traces of the touch signal traces, and reset voltage signal (Vi) traces of the voltage signal traces are multiplexed as touch sensing signal (RX) traces of the touch signal traces. Alternatively, the power voltage signal (VDD) traces of the voltage signal traces are multiplexed as touch sensing signal (RX) traces of the touch signal traces, and reset voltage signal (Vi) traces of the voltage signal traces are multiplexing as touch driving signal (TX) traces of the touch signal traces. IF the OLED touch display panel of the present invention is a self-capacitance touch display panel, the power voltage signal (VDD) traces or the reset voltage signal (Vi) traces of the voltage signal traces are multiplexed as touch signal (TP) traces.

If the touch display panel is a mutual-capacitance touch display panel, in the display area of the touch display panel, the voltage signal traces are divided according to the sizes of the sensor pads, and the touch driving electrodes of the sensor pads in the same row are connected in series, and the touch sensing electrodes of the sensor pads in the same column are connected in series.

Preferably, outside the display area of the touch display panel, each of input ends of the touch signal traces is provided with a time division multiplexing circuit unit. When the touch display panel is in the display period, the display driving module inputs a voltage signal to the touch display panel through all the time division multiplexing circuit units. When the touch display panel is in the touch period, the touch module inputs a touch driving signal or a touch driving composite signal to the touch display panel through all the time division multiplexing circuit units, and the touch module receives a touch sensing signal or a touch sensing composite signal generated by corresponding sensor pads of the touch display panel.

The array substrate may be an array substrate using low temperature polysilicon (LTPS) technology. Referring to FIG. 1 for a specific touch display panel structure.

The display driving module and the touch module may be integrated in the same chip (for example, a TDDI chip), or may be in independently controlled discrete ICs (for example, a conventional touch chip and a display driving chip).

The OLED touch display panel with a patterned cathode of the present invention uses a pixel definition layer (PDL) of a LTPS array substrate to form sensor pads (TX Sensor Pads, RX Sensor Pads). By adding a time division multiplexing circuit unit to each voltage signal input traces outside the display area of the touch display panel, the power signal traces of the source and drain layer of the LTPS array substrate are multiplexed (i.e. using the existing control signal as an input). In the display period, input a corresponding voltage signal, i.e. a power voltage signal VDD and a reset voltage signal Vi, from a driver-IC (D-IC) to the touch display panel. In the touch period, the voltage signal traces is multiplexed as the touch signal traces, and the touch signal traces is used to input the touch driving signal TX from the touch-IC (T-IC) to the sensor pads of the touch display panel, and receive the touch sensing signal RX generated by the corresponding sensor pads of the touch display panel, thereby detecting whether the self-capacitance or the mutual capacitance of the sensor pads changes. The OLED touch display panel of the present invention provides a specific signal circuit for the mutual capacitance/self capacitance structure of the in-cell touch display panel of the OLED touch display panel by the time division multiplexing circuit unit. Time-division input and output of a touch signal TX/RX and a voltage signal Vi/VDD of a mutual-capacitance in-cell touch display panel, or time-division input and output of a touch signal TP and a voltage signal Vi/VDD of a self-capacitance in-cell touch display panel are achieved. There is no need to add layers, and the pixel structure does not need to add extra traces, so the pixel space and cost can be reduced, and peeling during the flexible screen bending process can be prevented. The invention is applicable to a touch and display driver integration (TDDI) IC integrated by a touch chip and a display driver chip, or to a discrete IC assembly controlled independently by an existing touch IC (T-IC) and a display driver IC (D-IC), so there is no need to develop new high-cost TDDI ICs.

Figure 5A:
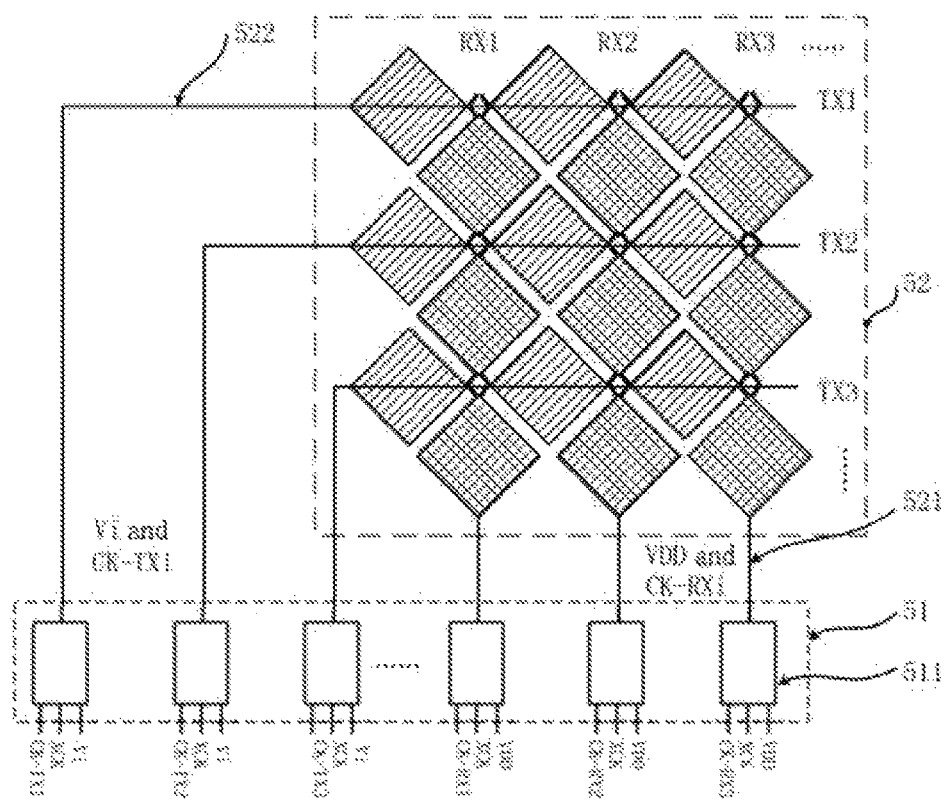
FIG. 5A is a diagram showing a mutual capacitance time division multiplexing architecture of a first embodiment of the present invention.
Figure 5B:
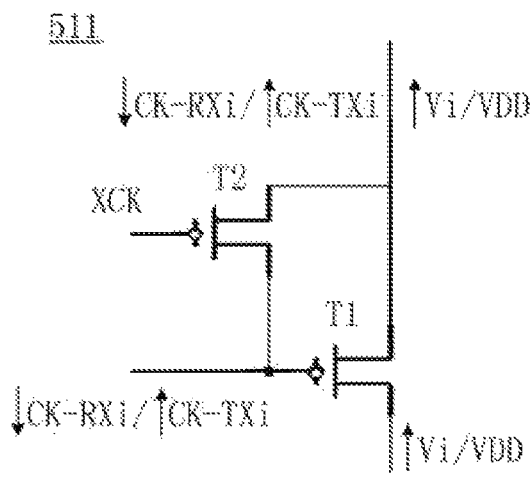
FIG. 5B is a diagram showing a mutual capacitance time division multiplexing circuit of the first embodiment of the present invention.
Figure 5C:
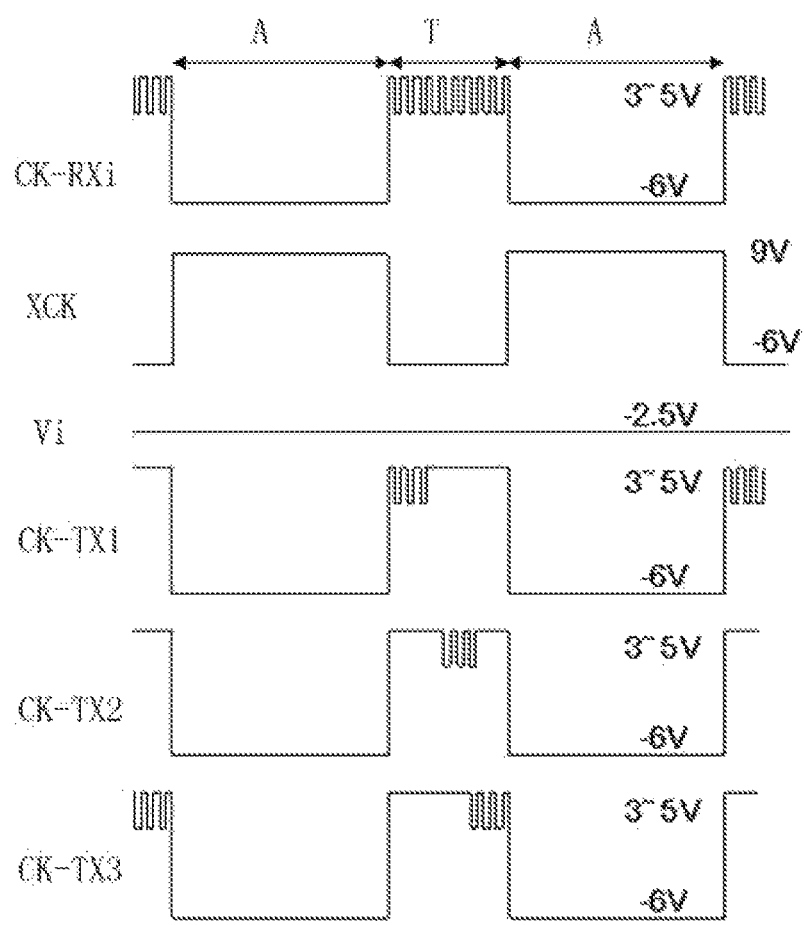
FIG. 5C is a timing diagram of time division multiplexing driving of the first embodiment of the OLED touch display panel of the present invention.
Figure 5D:
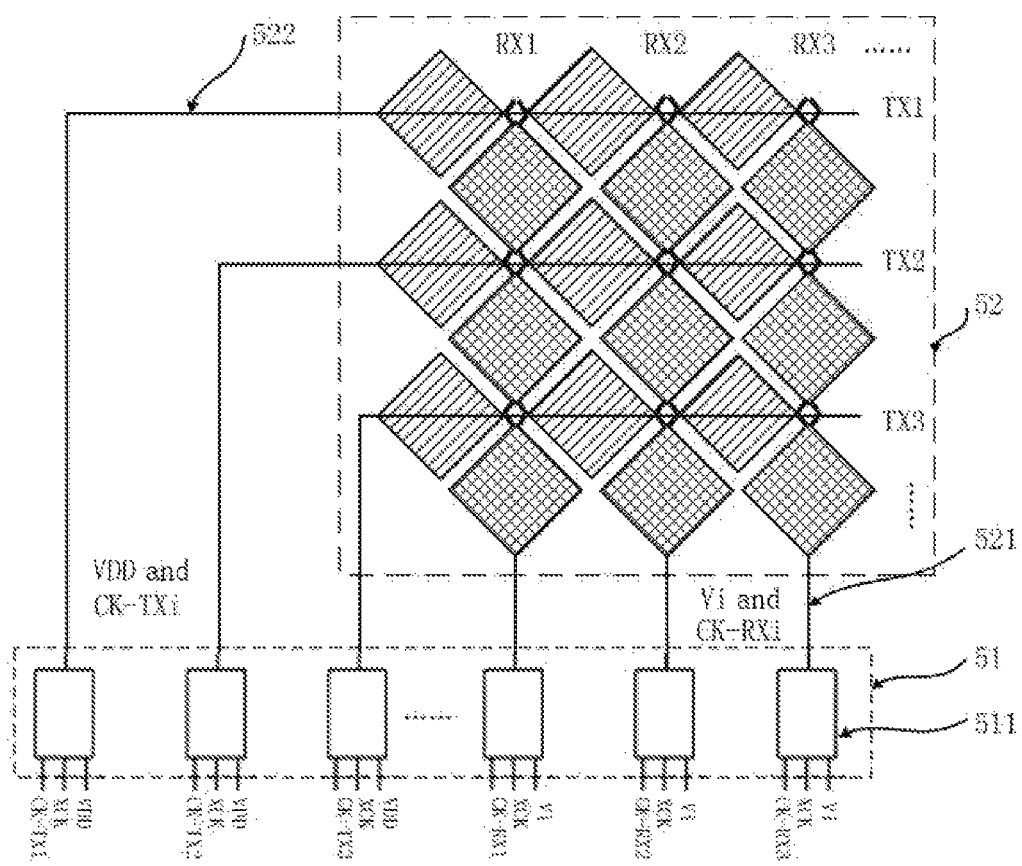
FIG. 5D is a diagram showing a mutual capacitance time division multiplexing architecture of a second embodiment of the present invention.

Referring to FIG. 5A-5D, wherein FIG. 5A is a diagram of a mutual capacitance time division multiplexing architecture of a first embodiment of an OLED touch display panel according to the present invention, FIG. 5B is a diagram showing a mutual capacitance time division multiplexing circuit of a first embodiment of an OLED touch display panel according to the present invention, FIG. 5C is a timing diagram of a mutual capacitance time division multiplexing driving of the first embodiment of the OLED touch display panel of the present invention, and FIG. 5D is a diagram of a mutual capacitance time division multiplexing architecture of a second embodiment of an OLED touch display panel according to the present invention.

As shown in FIG. 5A, in the embodiment, outside the display area of the touch display panel (the area indicated by reference numeral 51 in the figure), each of the input ends of the touch signal traces is provided with a time division multiplexing circuit unit 511. In the display area 52 of the touch display panel, the power voltage signal traces of the voltage signal traces of the source and drain layer are multiplexed as the touch sensing signal traces of the sensor pads (As shown by reference numeral 521 in the figure, the power supply voltage signal VDD and the touch sensing signal RXi are integrated on the traces 521). The reset voltage signal traces in the voltage signal traces of the source and drain layer are multiplexed as touch driving signal TX traces of the sensor pads (As shown by reference numeral 522 in the figure, the integrated reset voltage signal Vi and the touch driving signal TXi are integrated on the traces 522).

When the touch display panel is in the display period, the display driving chip (D-IC) inputs the power voltage signal VDD and the reset voltage signal Vi to the touch display panel through all the time division multiplexing circuit units 511 respectively, to supply a power voltage signal VDD or a reset voltage signal Vi to a corresponding pixel circuit of the touch display panel. Specifically, the display driving chip (D-IC) supplies a reset voltage signal Vi to the pixel circuits of the touch display panel in the same row through the time division multiplexing circuit units 511, and the display driving chip supplies a power voltage signal VDD to the pixel circuits of the touch display panel in the same column through the time division multiplexing circuit units 511. When the touch display panel is in the touch period, the touch chip (T-IC) inputs the touch driving composite signal CK-TXi to the touch display panel through all the time division multiplexing circuit units 511 respectively, and the touch chip (T-IC) receives the touch sensing composite signal CK-RXi generated by the corresponding sensor pads of the touch display panel. Specifically, the touch chip (T-IC) supplies a touch driving composite signal CK-TXi to the sensor pads of the touch display panel in the same row through the time division multiplexing circuit units 511, and the touch chip receives the touch sensing composite signal CK-RXi generated by the sensor pads of the touch display panel in the same column through the time division multiplexing circuit units 511.

Specifically, in the display area 52 of the touch display panel, the voltage signal traces are divided according to the sizes of the sensor pads, and the touch drive electrodes in the same row are connected in series, and the touch sensing electrodes in the same column are connected in series.

As shown in FIG. 5B, the time division multiplexing circuit unit 511 includes a first thin film transistor T1 and a second thin film transistor T2. A gate of the first thin film transistor T1 receives the touch driving composite signal CK-TXi synthesized by the first level signal CK and the touch driving signal TXi. Alternatively, the gate of the first thin film transistor T1 outputs a touch sensing composite signal CK-RXi synthesized by the first level signal CK and the touch sensing signal RXi, i.e. the touch driving signal TXi output by the touch chip (T-IC) and the touch sensing signal RXi generated by the corresponding sensor pads of the touch display panel are synthesized with the first level signal CK. A source of the first thin film transistor T1 receives a power supply voltage signal VDD or a reset voltage signal Vi output by a display driving chip (D-IC), and a drain of the first thin film transistor T1 outputs the power voltage signal VDD or the reset voltage signal Vi when the touch display panel is in the display period. The drain further outputs the touch driving composite signal CK-TXi or receives the touch sensing composite signal CK-RXi when the touch display panel is in the touch period, i.e. the drain thereof is separately electrically connected to the source and drain layer and the sensor pads on the array substrate. A gate of the second thin film transistor T2 receives the second level signal XCK, a source of the second thin film transistor T2 is shorted to the gate of the first thin film transistor T1, and a drain of the second thin film transistor T2 is shorted to the drain of the first thin film transistor T1, i.e. the common drain of the two thin film transistors. The first level signal CK and the second level signal XCK are reciprocal signals, and when the first level signal CK is a high level signal, the second level signal XCK is a low level signal; when the first level signal CK is a low level signal, the second level signal XCK is a high level signal. The first level signal CK and the second level signal XCK are both output by the touch chip.

Specifically, when the time division multiplexing circuit unit 511 is connected to the input end of the touch sensing signal traces, the gate of the first thin film transistor T1 outputs a touch sensing composite signal CK-RXi synthesized by a first level signal CK and a touch sensing signal RXi, the source of the first thin film transistor T1 receives the power voltage signal VDD output by the display driver chip (D-IC), and the drain of the first thin film transistor T1 outputs the power voltage signal VDD when the touch display panel is in the display period. The drain further receives the touch sensing composite signal CK-RXi when the touch display panel is in the touch period. When the time division multiplexing circuit unit 511 is connected to the input end of the touch control signal traces, the gate of the first thin film transistor T1 receives touch driving composite signal CK-TXi synthesized by the first level signal CK and the touch driving signal TXi, the source of the first thin film transistor T1 receives the reset voltage signal Vi output by the display driver chip (D-IC), and the drain of the first thin film transistor T1 outputs the reset voltage signal Vi when the touch display panel is in the display period. The drain further outputs the touch driving composite signal CK-TXi when the touch display panel is in the touch period.

In this embodiment, the first thin film transistor T1 and the second thin film transistor T2 are both PMOS type thin film transistors. In other embodiments, the first thin film transistor T1 and the second thin film transistor T2 may also be NMOS thin film transistors.

As shown in FIG. 5C, when the touch display panel is in the display period (such as the stage indicated by A in the figure), the touch driving composite signal CK-TXi (such as CK-TX1, CK-TX2, and CK-TX3 in the figure) or the touch sensing composite signal CK-RXi is a low level signal, the first thin film transistor T1 is turned on, the second level signal XCK is a high level signal, and the second thin film transistor T2 is turned off. The signal Vi of the display driver chip (D-IC) is input to the touch display panel to provide a reset signal to the pixel, or the signal VDD of the display driver chip (D-IC) is input to the touch display panel to provide power signal to the pixel. When the touch display panel is in the touch period (such as the stage indicated by T in the figure), the touch driving composite signal CK-TXi or the touch sensing composite signal CK-RXi is a high level signal, the first film The transistor T1 is turned off, the voltage signal ViNDD cannot be input to the panel, the second level signal XCK is a low level signal, and the second thin film transistor T2 is turned on. The touch sensing composite signal CK-TXi of the touch chip (T-IC) is input to the AA area of the touch display panel, or the touch sensing composite signal CK-RXi of the corresponding sensor pads of the touch display panel is output. In the touch period, the timing corresponding to the touch driving composite signal CK-TXi is a high frequency timing scanning high signal, and the timing corresponding to the touch sensing composite signal CK-RXi is a high frequency alternating high level signal.

As shown in FIG. 5D, the difference between this embodiment and the first embodiment shown in FIG. 5A is that in the display area 52 of the touch display panel, the power voltage signal traces of the voltage signal traces of the source and drain layer are multiplexed as touch driving signal TX traces of the sensor pads (the power supply voltage signal VDD and the touch driving signal TXi are integrated on the traces indicated by the numeral 521 in the figure), and the reset voltage signal traces of the voltage signal traces of the source and drain layer are multiplexed as the touch sensing signal traces of the sensor pads (the reset voltage signal Vi and the touch sensing signal RXi are integrated on the traces indicated by the numeral 522 in the figure). Correspondingly, the input signal of the time division multiplexing circuit unit 511 is also adjusted accordingly, and its working principle is similar to that of FIG. 5A, and details are not described herein again.

In this invention, by adding a time division multiplexing circuit unit to the input end of each touch signal trace outside the display area of the touch display panel, using the existing D-IC to input a reset voltage signal Vi (or a power voltage signal VDD), and using the existing T-IC to input a touch driving signal TXi (or a touch sensing signal RXi), the reset voltage signal Vi traces in the display area can be shared in the display period and in the touch period. Therefore, there is no need to make two metal layers of the sensor pads and two insulating layers, so the touch display panel does not need to add layers, and the pixel structure does not need to add extra traces. The invention can adopt D-IC+T-IC discrete solution or TDDI solution to complete system design.

Figure 6A:
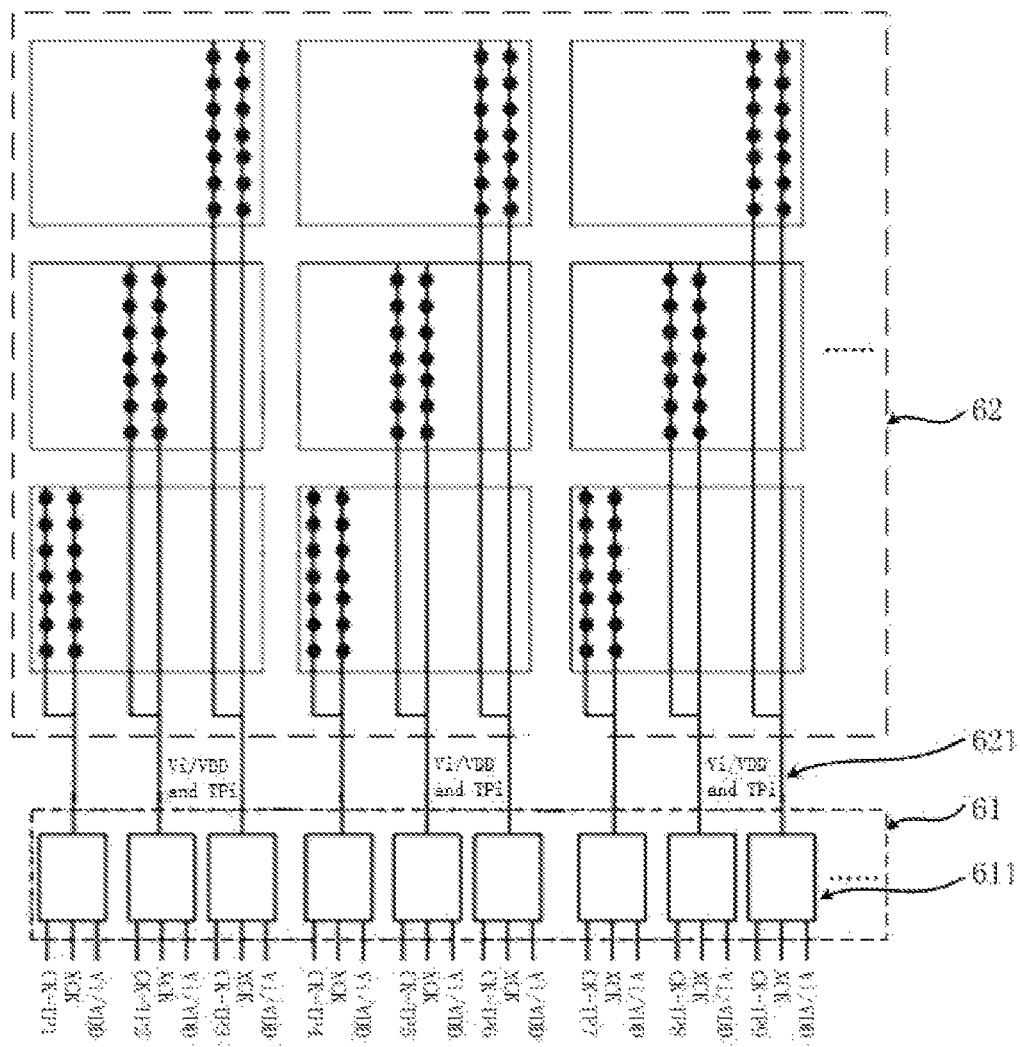
FIG. 6A is a self-capacitative time division multiplexing architecture diagram of a first embodiment of the present invention.
Figure 6B:
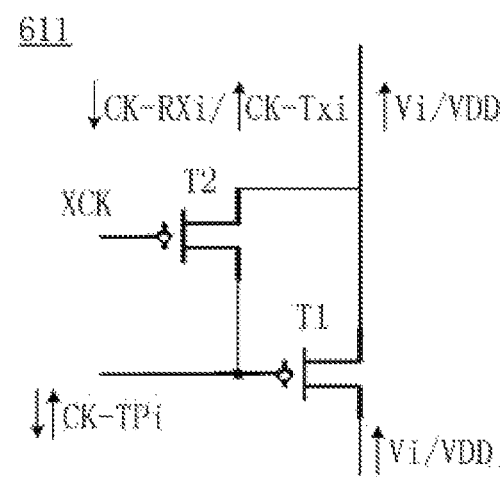
FIG. 6B is a self-capacitative time division multiplexing circuit diagram of the first embodiment of the present invention.

Referring to FIGS. 6A-6B, FIG. 6A is a self-capacitative time division multiplexing architecture diagram of a first embodiment of the present invention, and FIG. 6B is a self-capacitative time division multiplexing circuit diagram of the first embodiment of the present invention.

As shown in FIG. 6A, in the present embodiment, outside the display area of the touch display panel (for example, the area indicated by reference numeral 61 in the figure), the input end of each touch signal trace is provided with a time division multiplexing circuit unit 611. The difference from the mutual-capacitance time-division multiplexing architecture of the first embodiment shown in FIG. 5A is that, in this embodiment, the OLED touch display panel is self-capacitative, in the display area 62 of the touch display panel, the voltage signal traces (the power voltage signal traces or the reset voltage signal traces) of the source and drain layer are multiplexed as the touch signal traces of the sensor pads. Only one voltage signal trace is used to transmit the touch signal TP (the power voltage signal VDD or the reset voltage signal Vi is integrated with the touch signal TPi on the traces indicated by the numeral 621 in the figure).

As shown in FIG. 6B, the difference from the mutual capacitance time division multiplexing circuit diagram of the first embodiment shown in FIG. 5B is that, in the embodiment, the gate of the first thin film transistor T1 is transmits and receives a touch composite signal CK-TPi synthesized by a first level signal and a touch signal (i.e. synthesized by a touch signal TPi output by a touch chip (T-IC) and a first level signal CK). In the embodiment, the circuit connection mode, the working principle, and the circuit timing of the self-capacitance OLED touch display panel are similar to those of the mutual-capacitance OLED touch display panel shown in FIG. 5A-5C, so details are not described herein again.

Figure 7A:
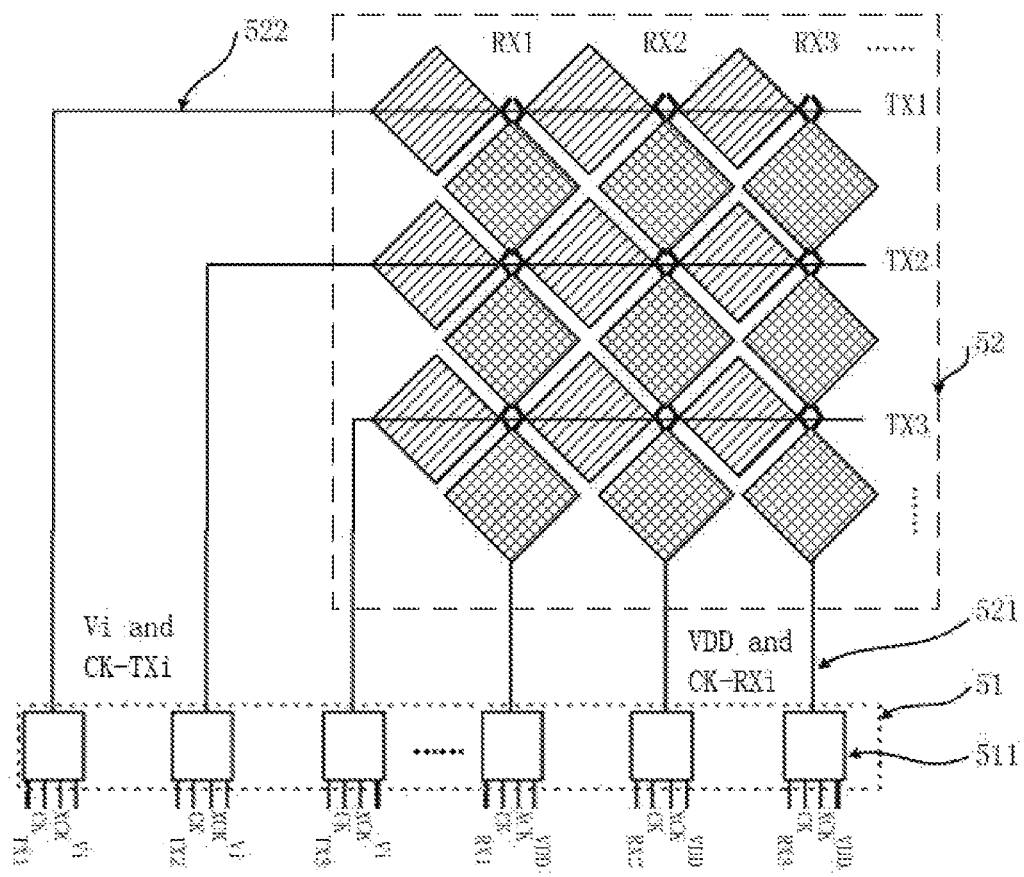
FIG. 7A is a diagram of a mutual capacitance time division multiplexing architecture of a third embodiment of the present invention.
Figure 7B:
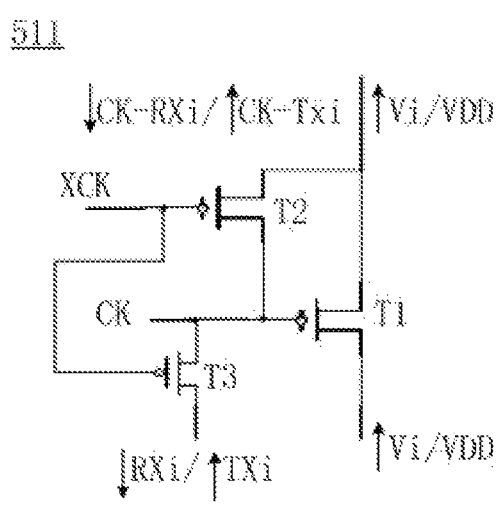
FIG. 7B is a diagram showing a mutual capacitance time division multiplexing circuit of a third embodiment of the present invention.
Figure 7C:
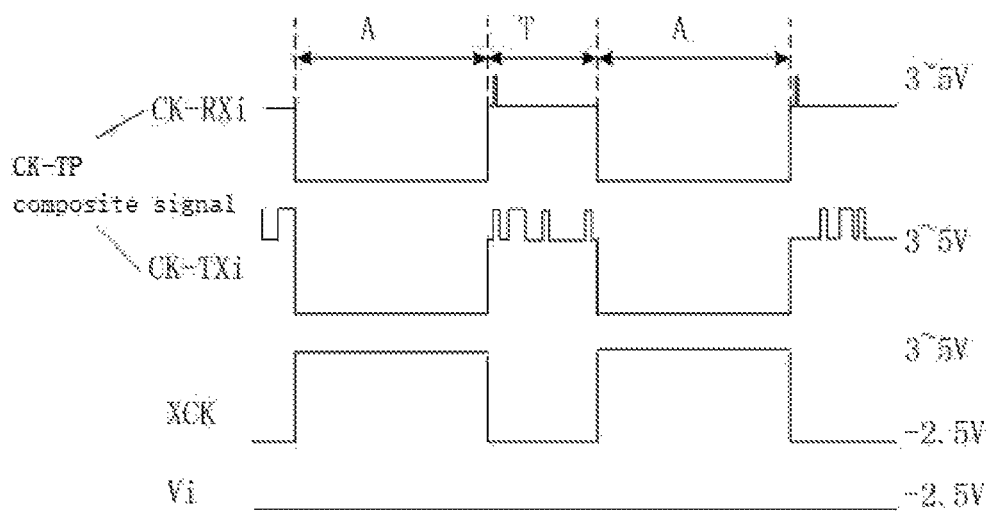
FIG. 7C is a timing diagram of a time division multiplexing driving of the third embodiment of the present invention.
Figure 7D:
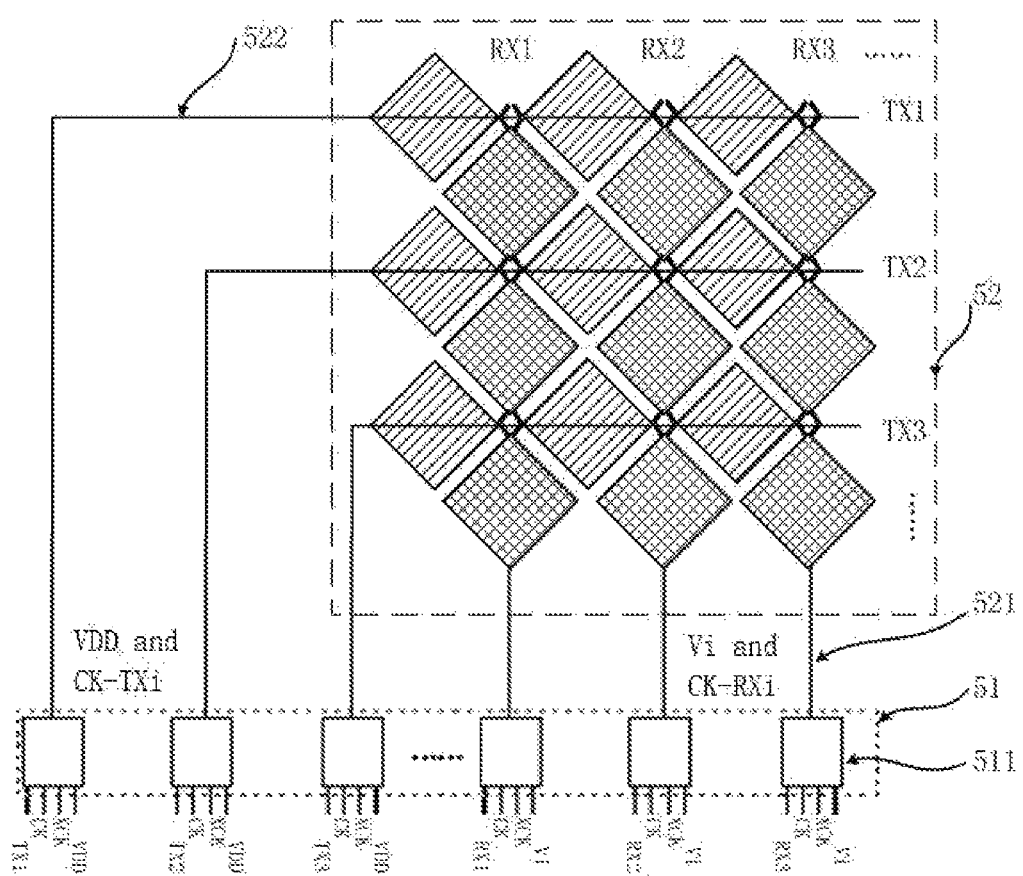
FIG. 7D is a diagram of a mutual capacitance time division multiplexing architecture of a fourth embodiment of the present invention.

Referring to FIGS. 7A-7D, wherein FIG. 7A is a mutual capacitance time division multiplexing architecture diagram of a third embodiment of the present invention, and FIG. 7B is a mutual capacitance time division multiplexing circuit diagram of the third embodiment of the present invention. FIG. 7C is a timing division multiplexing driving timing diagram of a third embodiment of the present invention, and FIG. 7D is a mutual capacitance time division multiplexing architecture diagram of the fourth embodiment of the present invention.

As shown in FIG. 7A, the difference from the mutual-capacitance time division multiplexing architecture diagram of the first embodiment shown in FIG. 5A is that, in the embodiment, the first level signal CK and the touch driving signal TXi are two individual signals before they enter the time division multiplexing circuit unit 511. Then the time division multiplexing circuit unit 511 synthesizes the first level signal CK and the touch driving signal TXi, so the signal input to the panel is the touch driving composite signal CK-Txi. Similarly, the first level signal CK and the touch sensing signal RXi are two individual signals before they enter the time division multiplexing circuit unit 511. The time division multiplexing circuit unit 511 synthesizes the first level signal CK and the touch sensing signal RXi, As shown in FIG. 7B, the time division multiplexing circuit unit 511 includes a first thin film transistor T1, a second thin film transistor T2, and a third thin film transistor T3. The gate of the first thin film transistor T1 receives the first level signal CK, the source of the first thin film transistor T1 receives the power voltage signal VDD or the reset voltage signal Vi output by the display driving chip (D-IC), and the drain of the first thin film transistor T1 outputs the power voltage signal VDD or the reset voltage signal Vi when the touch display panel is in the display period. The drain further outputs the touch driving composite signal CK-TXi or receives the touch sensing composite signal CK-RXi when the touch display panel is in the touch period (i.e. the drain is separately electrically connected to the source and drain layer and the sensor pads on the array substrate). The gate of the second thin film transistor T2 receives the second level signal XCK, the source of the second thin film transistor T2 is shorted to the gate of the first thin film transistor T1, and the drain of the second thin film transistor T2 is shorted to the drain of the first thin film transistor T1. The gate of the third thin film transistor T3 is shorted to the gate of the second thin film transistor T2 (receiving the second level signal XCK), and the source of the third thin film transistor T3 receives the touch driving signal TXi or outputs the touch sensing signal RXi, and the drain of the third thin film transistor T3 is shorted to the gate of the first thin film transistor T1. The first level signal CK and the second level signal XCK are reciprocal signals, and when the first level signal CK is a high level signal, the second level signal XCK is a low level. a signal; when the first level signal CK is a low level signal, the second level signal XCK is a high level signal. The first level signal CK and the second level signal XCK are both output by the touch chip.

Specifically, when the time division multiplexing circuit unit 511 is connected to the input end of the touch sensing signal trace, the source of the first thin film transistor T1 receives a power voltage signal VDD output by the display driving chip (D-IC), and a drain of the first thin film transistor T1 outputs the power voltage signal VDD when the touch display panel is in a display period. The drain further receives the touch sensing composite signal CK-RXi when the touch display panel is in the touch period. The source of the third thin film transistor T3 outputs a touch sensing signal RXi. When the time division multiplexing circuit unit 511 is connected to the input end of the touch control signal traces, the source of the first thin film transistor T1 receives the reset voltage signal Vi output by the display driving chip (D-IC), and the drain of the first thin film transistor T1 outputs the reset voltage signal Vi when the touch display panel is in the display period. The drain further outputs the touch driving composite signal CK-TXi when the touch display panel is in the touch period. The source of the third thin film transistor T3 receives the touch driving signal TXi.

In this embodiment, the first thin film transistor T1 and the second thin film transistor T2 are both PMOS type thin film transistors. In other embodiments, the first thin film transistor T1 and the second thin film transistor T2 may also be NMOS thin film transistors.

As shown in FIG. 7C, in the display period of the touch display panel (as indicated by A in the figure), the first level signal CK is a low level signal, the first thin film transistor T1 is turned on, the second level signal XCK is a high level signal, and the second thin film transistor T2 and the third thin film transistor T3 are disconnected. The Vi signal of the display driver chip (D-IC) is input to the inside of the touch display panel (Panel) to provide a reset signal to the pixel. Alternatively, the VDD signal of the display driver chip (D-IC) is input to the inside of the touch display panel to provide a power signal to the pixel. In the touch period of the touch display panel (such as the stage indicated by T in the figure), the first level signal CK is a high level signal, the first thin film transistor T1 is turned off, the voltage signal ViNDD cannot be input to the panel, the second level signal XCK is a low level signal, and the second thin film transistor T2 and the third thin film transistor T3 are turned on. The touch driving signal TXi of the touch chip (T-IC) and the first level signal CK are synthesized as a touch driving composite signal CK-TXi input to the AA area of the touch display panel. Alternatively, the touch sensing signal RXi of the corresponding sensor pads of the touch display panel and the first level signal CK are synthesized as a touch sensing composite signal CK-RXi. In the touch period, the timing corresponding to the touch driving composite signal CK-TXi is a high frequency timing scanning high signal, and the timing corresponding to the touch sensing composite signal CK-RXi is a high frequency alternating high signal.

As shown in FIG. 7D, the difference from the third embodiment shown in FIG. 7A is that, in the embodiment, in the display area 52 of the touch display panel, the power voltage signal traces of the voltage signal traces in the source and drain layer are multiplexed as the touch driving signal TX traces of the sensor pads (as shown in the figure, the power supply voltage signal VDD and the touch driving signal TXi are integrated on the traces 521), and the reset voltage signal traces of the voltage signal traces in the source and drain layer are multiplexed as the touch sensing signal traces of the sensor pads (as shown in the figure, the reset voltage signal Vi and the touch sensing signal RXi are integrated on the traces 522). Correspondingly, the input signal of the time division multiplexing circuit unit 511 is also adjusted accordingly, and its working principle is similar to that of FIG. 7A, and details are not described herein again.

In this invention, by adding a time division multiplexing circuit unit to the input end of each touch signal trace outside the display area of the touch display panel, using the existing D-IC to input a reset voltage signal Vi (or a power voltage signal VDD), and using the existing T-IC to input a touch driving signal TXi (or a touch sensing signal RXi), the reset voltage signal Vi traces in the display area can be shared in the display period and in the touch period. Therefore, there is no need to make two metal layers of the sensor pads and two insulating layers, so the touch display panel does not need to add layers, and the pixel structure does not need to add extra traces. The invention can adopt D-IC+T-IC discrete solution or TDDI solution to complete system design.

Figure 8A:
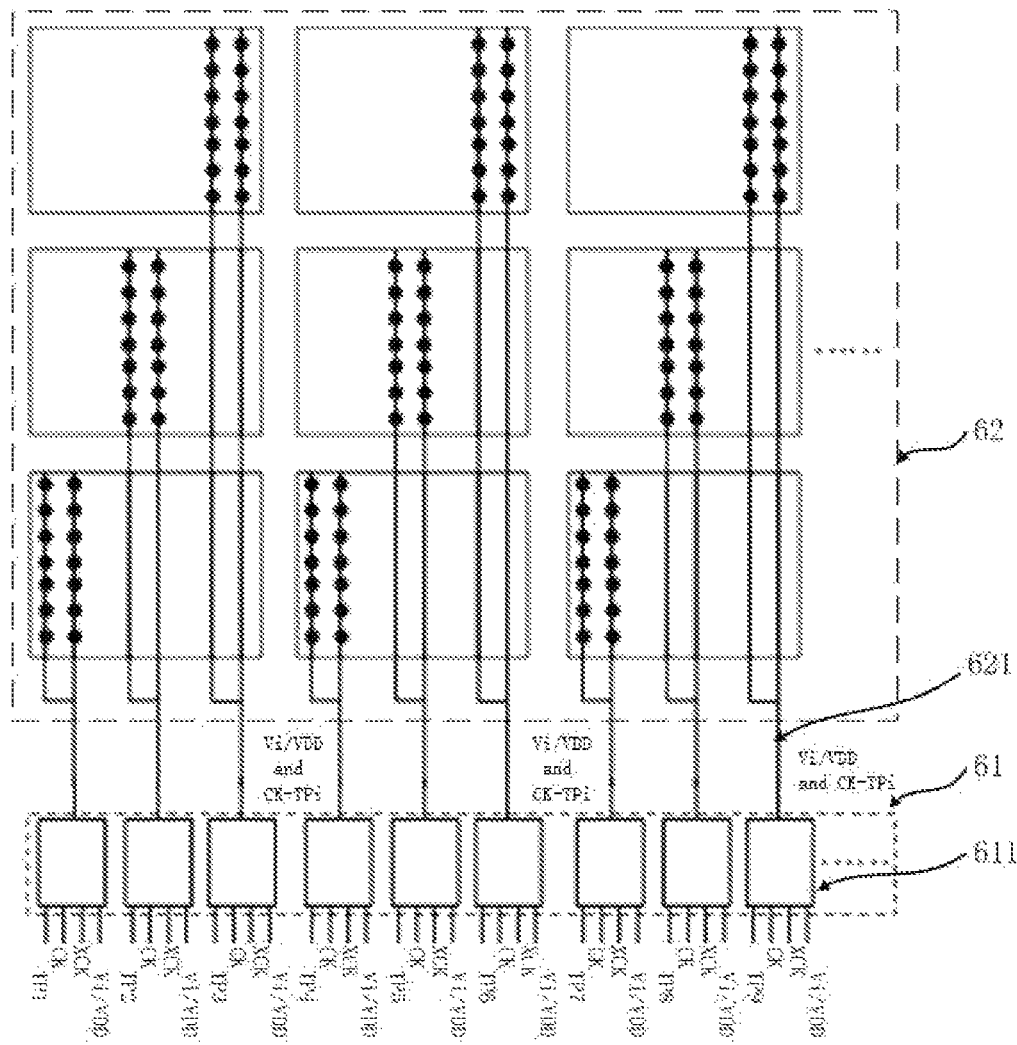
FIG. 8A is a self-capacitative time division multiplexing architecture diagram of a second embodiment of the present invention.
Figure 8B:
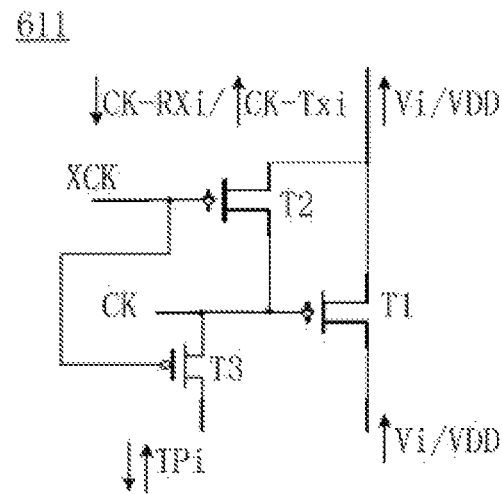
FIG. 8B is a self-capacitative time division multiplexing circuit diagram of a second embodiment of the present invention.

Referring to FIGS. 8A-8B, wherein FIG. 8A is a self-capacitative time division multiplexing architecture diagram of a second embodiment of an OLED touch display panel according to the present invention, and FIG. 8B is a self-capacitative time division multiplexing circuit diagram of a second embodiment of an OLED touch display panel according to the present invention.

As shown in FIG. 8A, in the embodiment, outside the display area of the touch display panel (the area indicated by reference numeral 61 in the figure), the input end of each touch signal trace is provided with a time division multiplexing. Circuit unit 611.

As shown in FIG. 8A, in the embodiment, outside the display area of the touch display panel (i.e. the area indicated by reference numeral 61 in the figure), the input end of each touch signal trace is provided with a time division multiplexing circuit unit 611. The difference from the mutual-capacitance time-division multiplexing architecture of the third embodiment shown in FIG. 7A is that, in this embodiment, the OLED touch display panel is a self-capacitative panel. In the display area 62 of the touch display panel, the voltage signal traces on the source and drain layer (power voltage signal traces or reset voltage signal traces) are multiplexed as the touch signal traces of the sensor pads. Only one voltage signal trace is used to transmit the touch signal TP (as shown in the figure, the power voltage signal VDD or the reset voltage signal Vi is integrated with the touch signal TPi on the traces indicated by the numeral 621).

As shown in FIG. 8B, the difference from the mutual capacitance time division multiplexing circuit diagram of the third embodiment shown in FIG. 7B is that, in this embodiment, the source of the third thin film transistor T3 transmits and receives the touch signal TPi output by the control chip (T-IC). In the embodiment, the circuit connection mode, the working principle, and the circuit timing of the self-capacitance OLED touch display panel are similar to those of the mutual-capacitance OLED touch display panel shown in FIG. 7A-7C, so details are not described herein again.

Figure 9A:
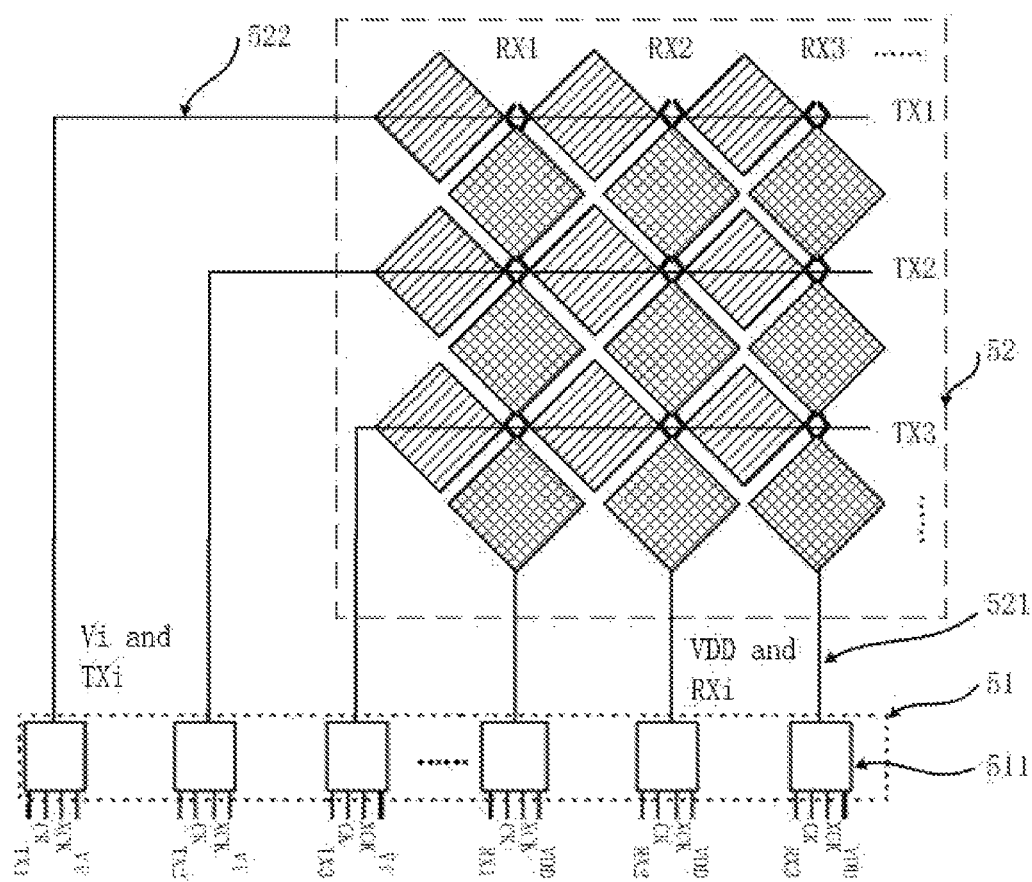
FIG. 9A is a diagram of a mutual capacitance time division multiplexing architecture of a fifth embodiment of the present invention.
Figure 9B:
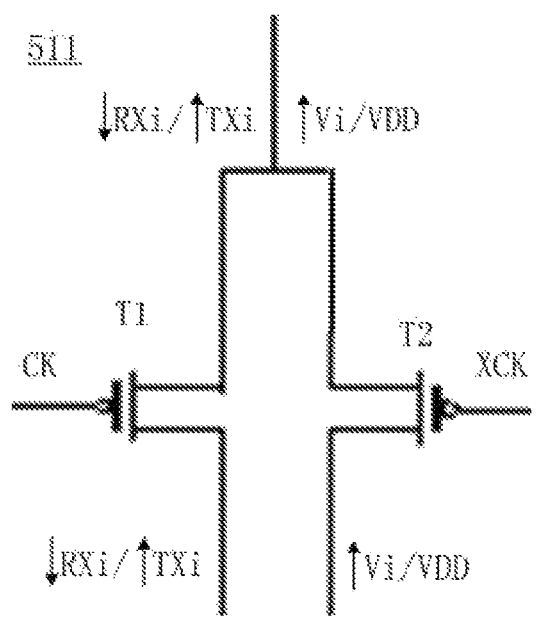
FIG. 9B is a diagram showing a mutual capacitance time division multiplexing circuit of a fifth embodiment of the present invention.
Figure 9C:
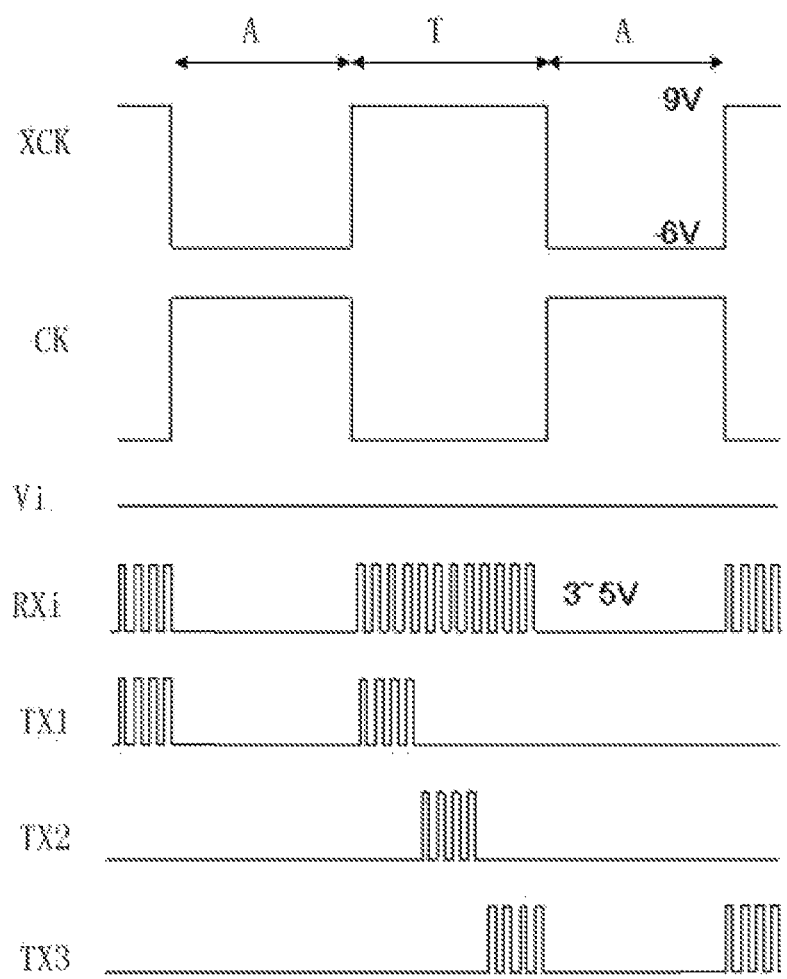
FIG. 9C is a timing diagram of a mutual capacitance time division multiplexing driving process of the fifth embodiment of the present invention.
Figure 9D:
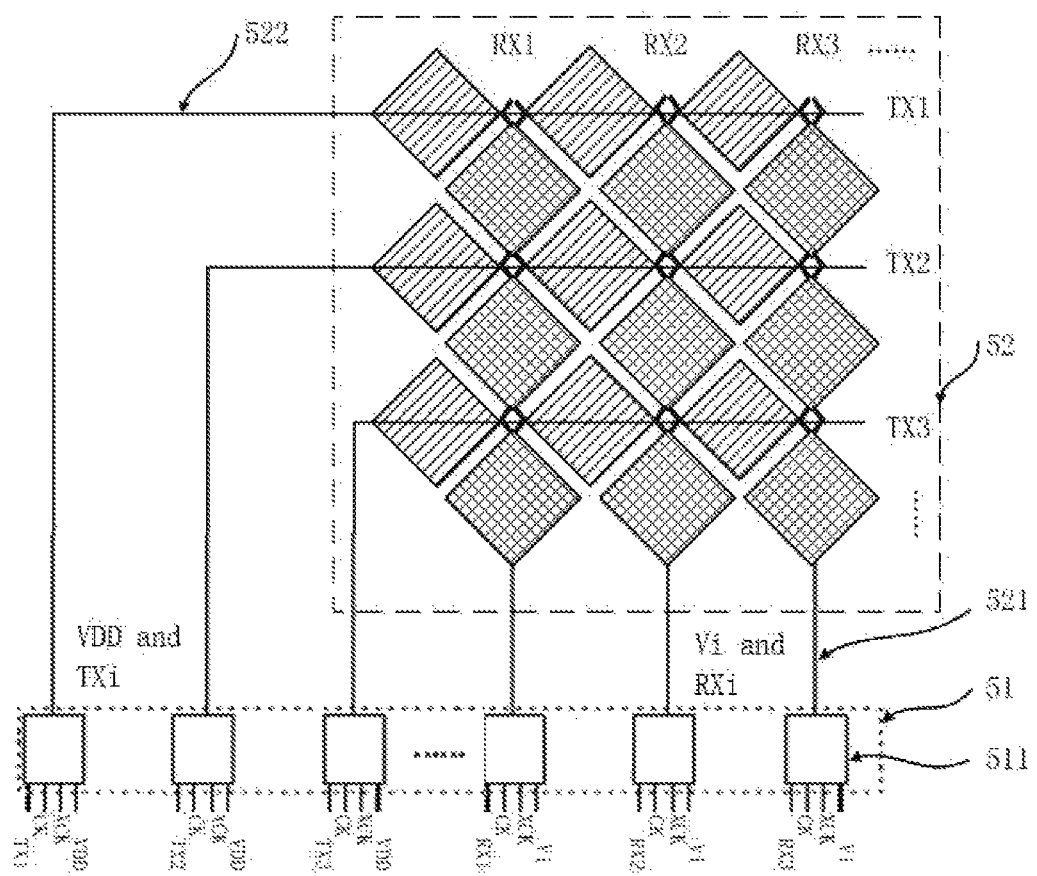
FIG. 9D is a diagram showing a mutual capacitance time division multiplexing architecture of a sixth embodiment of the present invention.

Referring to FIGS. 9A-9D, wherein FIG. 9A is a diagram of a mutual capacitance time division multiplexing architecture of a fifth embodiment of the OLED touch display panel of the present invention, FIG. 9B is a diagram showing a mutual capacitance time division multiplexing circuit of the fifth embodiment of the OLED touch display panel of the present invention, FIG. 9C is a timing diagram of a mutual capacitance time division multiplexing driving process of a fifth embodiment of the OLED touch display panel of the present invention, and FIG. 9D is a diagram of a mutual capacitance time division multiplexing architecture of the sixth embodiment of the OLED touch display panel of the present invention;

As shown in FIG. 9A, outside the display area of the touch display panel (as indicated by reference numeral 51 in the figure), the input end of each voltage signal trace is provided with a time division multiplexing circuit unit 511. In the display area 52 of the touch display panel, the power voltage signal traces of the voltage signal traces in the source and drain layer are multiplexed as the touch sensing signal traces of the sensor pads (as shown in the figure, the power voltage signal VDD and the touch sensing signal RXi are integrated on the traces 521), the reset voltage signal traces of the voltage signal traces in the source and drain layer are multiplexed as the touch driving signal TX traces of the sensor pads (as shown in the figure, the reset voltage signal Vi and the touch driving signal TXi are integrated on the traces 522).

When the touch display panel is in the display period, the display driving chip (D-IC) inputs a power voltage signal VDD and a reset voltage signal Vi respectively to the touch display panel through all the time division multiplexing circuit units 511, to provide the power voltage signal VDD or the reset voltage signal Vi to a corresponding pixel circuit of the touch display panel. Specifically, the display driving chip (D-IC) applies a reset voltage signal Vi to the same row of pixel circuits of the touch display panel through the time division multiplexing circuit unit 511, and the display driving chip (D-IC) applies a power voltage signal VDD to the same column of pixel circuits of the touch display panel through the time division multiplexing circuit unit 511. When the touch display panel is in the touch period, the touch chip (T-IC) inputs the touch driving signal TXi to the touch display panel through all the time division multiplexing circuit units 511, and the touch chip (T-IC) receives the touch sensing signal RXi generated by the corresponding sensor pads of the touch display panel. Specifically, the touch chip (T-IC) provides the touch driving signal TXi to the same row of the sensor pads of the touch display panel through the time division multiplexing circuit unit 511, and the touch chip (T-IC) receives the touch sensing signal RXi generated by the same column of the sensor pads of the touch display panel through the time division multiplexing circuit unit 511.

Specifically, in the display area 52 of the touch display panel, the voltage signal traces are divided according to the sizes of the sensor pads, the sensor driving pads in the same row are connected in series, and the touch sensor pads in the same column are connected in series.

As shown in FIG. 9B, the time division multiplexing circuit unit 511 includes a first thin film transistor T1 and a second thin film transistor T2. The gate of the first thin film transistor T1 receives the first level signal CK, the source of the first thin film transistor T1 receives the touch driving signal TXi output by the touch chip (T-IC) or outputs the touch sensing signal RXi generated by the corresponding sensor pads of the touch display panel, and the drain of the first thin film transistor T1 outputs a power voltage signal VDD or a reset voltage signal Vi of the voltage signal when the touch display panel is in a display period. The drain further outputs the touch driving signal TXi or receives the touch sensing signal RXi when the touch display panel is in the touch period (i.e. electrically connecting the source and drain layer and the sensor pads on the array substrate respectively). The gate of the second thin film transistor T2 receives a second level signal XCK, the source of the second thin film transistor T2 receives a power voltage signal VDD or a reset voltage signal Vi output by the display driving chip (D-IC), and the drain of the second thin film transistor T2 is shorted to the drain of the first thin film transistor (i.e. the common drain of the two thin film transistors). Wherein the first level signal CK and the second level signal XCK are reciprocal signals, when the first level signal CK is a high level signal, the second level signal XCK is a low level signal; and when the first level signal CK is a low level signal, the second level signal XCK is a high level signal. The first level signal CK and the second level signal XCK are both output by the touch chip.

Specifically, when the time division multiplexing circuit unit 511 is connected to the input end of the touch sensing signal traces, the source of the first thin film transistor T1 outputs a touch sensing signal RXi, and the source of the second thin film transistor T2 receives the power voltage signal VDD output by the display driving chip (D-IC), the drain of the two thin film transistors T1 and T2 outputs the power voltage signal VDD when the touch display panel is in the display period, and the drain further receives the touch sensing signal RXi when the touch display panel is in the touch period. When the time division multiplexing circuit unit 511 is connected to the input end of the touch control signal traces, the source of the first thin film transistor T1 receives the touch driving signal TXi, and the source of the second thin film transistor T2 receives the reset voltage signal Vi output by the display driver chip (D-IC). The drain of the thin film transistors T1 and T2 outputs the reset voltage signal Vi when the touch display panel is in the display period, and the drain further outputs the touch driving signal TXi when the touch display panel is in the touch period.

In this embodiment, the first thin film transistor T1 and the second thin film transistor T2 are both PMOS type thin film transistors. In other embodiments, the first thin film transistor T1 and the second thin film transistor T2 may also be NMOS type thin film transistors.

As shown in FIG. 9C, in the display period of the touch display panel (as the stage indicated by A in the figure): the first level signal CK is a high level signal, the first thin film transistor T1 is turned off, the second level signal XCK is a low level signal, and the second thin film transistor T2 is turned on. The signal Vi of the display driver chip (D-IC) is input to the touch display panel to provide a reset signal to the pixel, or the signal VDD of the display driver chip (D-IC) is input to the touch display panel to provide power signal to the pixel. In the touch period of the touch display panel (as the stage indicated by T in the figure): the first level signal CK is a low level signal, the first thin film transistor T1 is turned on, the second level signal XCK is a high level signal, and the second thin film transistor T2 is turned off, and the voltage signal ViNDD cannot be input to the panel. The touch sensing composite signal CK-TXi of the touch chip (T-IC) is input to the AA area of the touch display panel, or the touch sensing composite signal CK-RXi of the corresponding sensor pads of the touch display panel is output.

As shown in FIG. 9D, the difference from the fifth embodiment shown in FIG. 9A is that, in the embodiment, in the display area 52 of the touch display panel, the power voltage signal traces of the voltage signal traces in the source and drain layer are multiplexed as the touch driving signal TX traces of the sensor pads (as shown in the figure, the power voltage signal VDD and the touch driving signal TXi are integrated on the traces 521), and the reset voltage signal traces of the voltage signal traces in the source and drain layer are multiplexed as the touch sensing signal traces of the sensor pads (as shown in the figure, the reset voltage signal Vi and the touch sensing signal RXi are integrated on the traces 522). Correspondingly, the input signal of the time division multiplexing circuit unit 511 is also adjusted accordingly, and its working principle is similar to that of FIG. 9A, and details are not described herein again.

In this invention, by adding a time division multiplexing circuit unit to the input end of each touch signal trace outside the display area of the touch display panel, using the existing D-IC to input a reset voltage signal Vi (or a power voltage signal VDD), and using the existing T-IC to input a touch driving signal TXi (or a touch sensing signal RXi), the reset voltage signal Vi traces in the display area can be shared in the display period and in the touch period. Therefore, there is no need to make two metal layers of the sensor pads and two insulating layers, so the touch display panel does not need to add layers, and the pixel structure does not need to add extra traces. The invention can adopt D-IC+T-IC discrete solution or TDDI solution to complete system design.

Figure 10A:
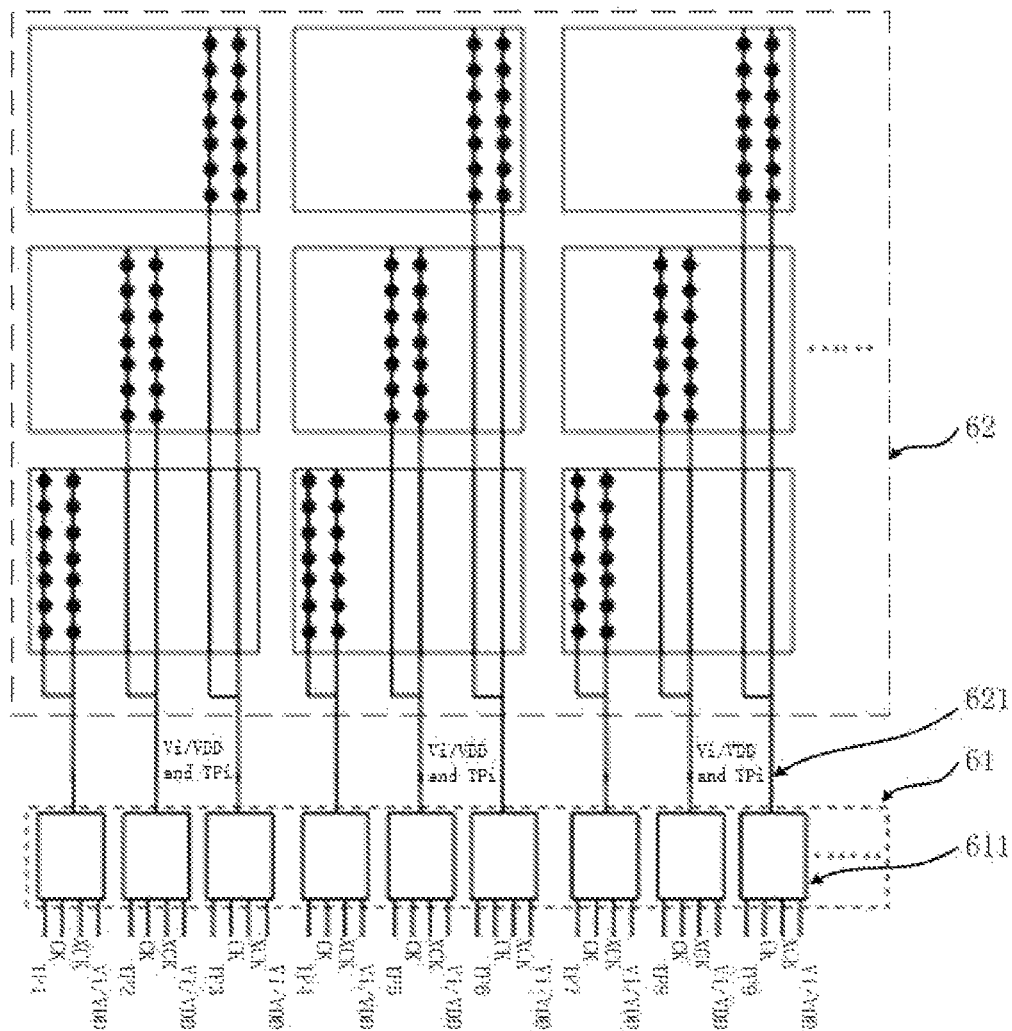
FIG. 10A is a self-capacitative time division multiplexing architecture diagram of a third embodiment of the present invention.
Figure 10B:
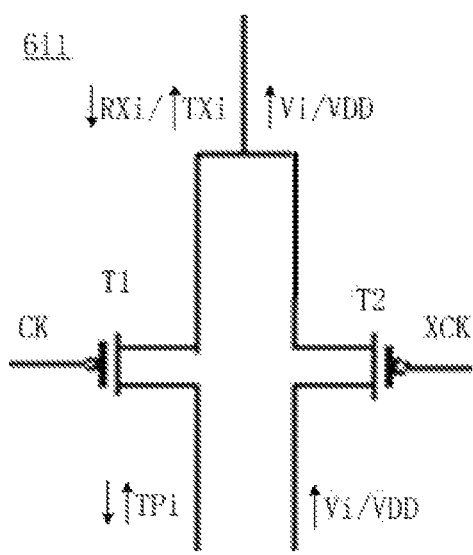
FIG. 10B is a self-capacitative time division multiplexing circuit diagram of a third embodiment of the present invention.

Referring to FIGS. 10A-10B, FIG. 10A is a self-capacitive time division multiplexing architecture diagram of a third embodiment of the OLED touch display panel of the present invention, and FIG. 10B is a self-capacitative time division multiplexing circuit diagram of a third embodiment of the OLED touch display panel of the present invention.

As shown in FIG. 10A, in the embodiment, outside the display area of the touch display panel (as indicated by reference numeral 61 in the figure), the input end of each touch signal trace is provided with a time division multiplexing circuit unit 611. The difference from the mutual capacitance time division multiplexing architecture diagram of the fifth embodiment shown in FIG. 9A is that, in the embodiment, the OLED touch display panel is a self-capacitative panel. In the display area 62 of the touch display panel, the voltage signal traces in the source and drain layer (the power voltage signal traces or the reset voltage signal traces) are multiplexed as the touch signal traces of the sensor pads. Only one voltage signal trace is used to transmit the touch signal TP (as shown in the figure, the power voltage signal VDD or the reset voltage signal Vi is integrated with the touch signal TPi on the traces indicated by the numeral 621).

As shown in FIG. 10B, the difference from the mutual capacitance time division multiplexing circuit diagram of the fifth embodiment shown in FIG. 9B is that, in the embodiment, the source of the first thin film transistor T1 transmits and receives the touch signal TPi output by the touch chip (T-IC). In the embodiment, the circuit connection mode, the working principle, and the circuit timing of the self-capacitance OLED touch display panel are similar to those of the mutual-capacitance OLED touch display panel shown in FIG. 9A-9C, so details are not described herein again.

Figure 11:
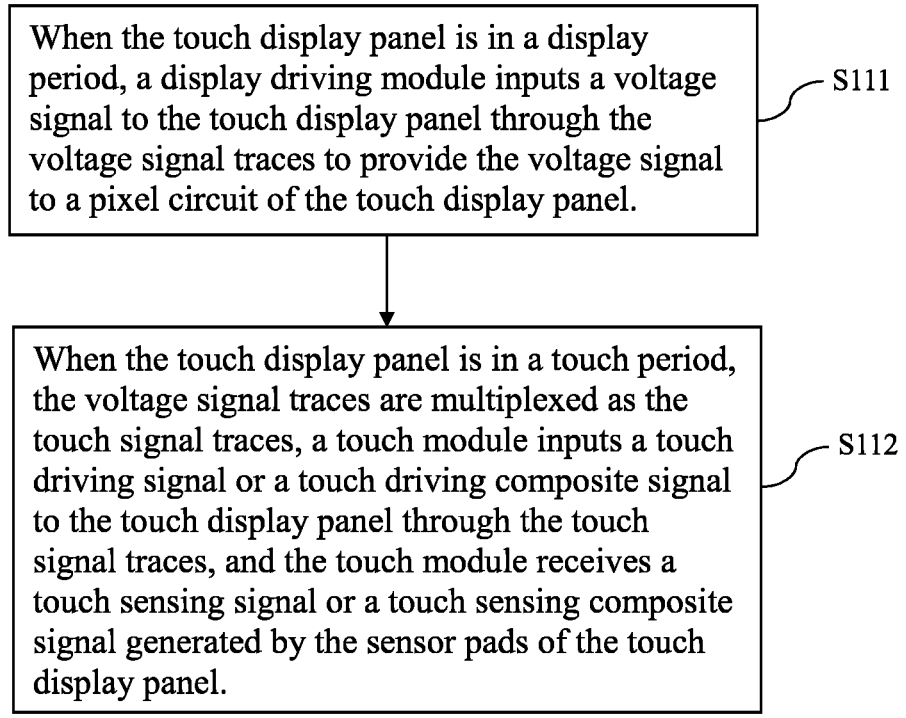
FIG. 11 is a flow chart of a method for driving time division multiplexing of the OLED touch display panel of the present invention.

Referring to FIG. 11, a flowchart of a method for driving time division multiplexing of an OLED touch display panel of the present invention is shown. The method includes the following steps: S111: when the touch display panel is in a display period, a display driving module inputs a voltage signal to the touch display panel through all voltage signal traces in the display area of the touch display panel to provide the voltage signal to a pixel circuit of the touch display panel. S112: when the touch display panel is in a touch period, the voltage signal traces are multiplexed as the touch signal traces, a touch module inputs a touch driving signal or a touch driving composite signal to the touch display panel through the touch signal traces, and the touch module receives a touch sensing signal or a touch sensing composite signal generated by the sensor pads of the touch display panel.

The method for multiplexing the voltage signal traces of the source and drain layer as the touch signal traces of the sensor pads is adopted in one of the following ways: if the OLED touch display panel of the present invention is a mutual-capacitance touch display panel, the power voltage signal (VDD) traces of the voltage signal traces are multiplexed as the touch driving signal (TX) traces of the touch signal traces, and the reset voltage signal (Vi) traces of the voltage signal traces are multiplexed as touch sensing signal (RX) traces of the touch signal traces. Alternatively, the power voltage signal (VDD) traces of the voltage signal traces are multiplexed as touch sensing signal (RX) traces of the touch signal traces, and the reset voltage signal (Vi) traces of the voltage signal traces are multiplexed as the touch driving signal (TX) traces of the touch signal traces. If the OLED touch display panel of the present invention is a self-capacitance touch display panel, the power voltage signal (VDD) traces or the reset voltage signal (Vi) traces of the voltage signal traces are multiplexed as touch signal (TP) traces.

Specifically, the touch display panel includes: a source and drain layer and a pixel defining layer (PDL) disposed on an array substrate, and sensor pads embedded in the pixel defining layer; in the display area of the touch display panel, the power voltage signal traces of the voltage signal traces in the source and drain layer are multiplexed as the touch sensing signal traces of the sensor pads, and the reset voltage signal traces of the voltage signal traces in the source and drain layer are multiplexed as the touch driving signal traces of the sensor pads. Alternatively, the power voltage signal traces of the voltage signal traces in the source and drain layer are multiplexed as the touch driving signal traces of the sensor pads, and the reset voltage signal traces of the voltage signal traces in the source and drain layer are multiplexed as the touch sensing signal traces of the sensor pads. The source and drain layer electrically connects to the display driving module through the voltage signal traces, and the sensor pads electrically connect to the touch module through the touch signal traces. The array substrate may be an array substrate using low temperature polysilicon technology. A specific touch display panel structure is shown in FIG. 1.

The display driving module and the touch module may be integrated in the same chip, or may be in independent controlled discrete chips.

Preferably, outside the display area of the touch display panel, each input end of the touch signal traces is provided with a time division multiplexing circuit unit.

The method further includes: when the touch display panel is in a display period, the display driving module inputs a voltage signal (a power voltage signal VDD and a reset voltage signal Vi) to the touch display panel through all the time division multiplexing circuit units; and when the touch display panel is in a touch period, the touch module inputs the touch driving signal TXi or the touch driving composite signal CK-TXi to the touch display panel through all the time division multiplexing circuit units, and the touch module receives a touch sensing signal RXi or a touch sensing composite signal CK-RXi generated by corresponding sensor pads of the touch display panel.

Industrial applicability: The subject matter of the present application can be manufactured and used in the industry with industrial applicability.

What is claimed is:

1. An organic light-emitting diode (OLED) touch display panel, comprising:
    a source and drain layer and a pixel defining layer (PDL) disposed on an array substrate, and sensor pads embedded in the pixel defining layer;
    wherein in a display area of the OLED touch display panel, voltage signal traces of the source and drain layer are multiplexed as touch signal traces of the sensor pads, wherein power voltage signal traces of the voltage signal traces are multiplexed as touch driving signal traces of the touch signal traces, and reset voltage signal traces of the voltage signal traces are multiplexed as touch sensing signal traces of the touch signal traces; or the power voltage signal traces of the voltage signal traces are multiplexed as the touch sensing signal traces of the touch signal traces, and the reset voltage signal traces of the voltage signal traces are multiplexed as the touch driving signal traces of the touch signal traces; or the power voltage signal traces or reset voltage signal traces of the voltage signal traces are multiplexed as the touch signal traces;
    wherein outside the display area of the OLED touch display panel, each of input ends of the touch signal traces is provided with a time division multiplexing circuit unit;
    wherein when the OLED touch display panel is in a display period, a display driving module inputs a voltage signal to the OLED touch display panel via the time division multiplexing circuit unit and the voltage signal traces to provide the voltage signal to a pixel circuit of the OLED touch display panel; and
    wherein when the OLED touch display panel is in a touch period, a touch module inputs a touch driving signal or a touch driving composite signal to the OLED touch display panel via the time division multiplexing circuit unit and the touch signal traces, and the touch module receives a touch sensing signal or a touch sensing composite signal generated by the sensor pads of the OLED touch display panel.

2. The OLED touch display panel as claimed in claim 1, wherein the OLED touch display panel is a mutual-capacitance touch display panel, in the display area of the touch display panel, the voltage signal traces are divided according to sizes of the sensor pads, and sensor driving pads of the sensor pads in a same row are connected in series, and touch sensor pads of the sensor pads in a same column are connected in series.

3. The OLED touch display panel as claimed in claim 1, wherein the time division multiplexing circuit unit comprises a first thin film transistor and a second thin film transistor;
    wherein a gate of the first thin film transistor receives the touch driving composite signal synthesized by a first level signal and the touch driving signal, or the touch sensing composite signal synthesized by the first level signal and the touch sensing signal, a source of the first thin film transistor receives a power voltage signal or a reset voltage signal of the voltage signal, and a drain of the first thin film transistor outputs the power voltage signal or the reset voltage signal when the OLED touch display panel is in the display period, the drain further outputs the touch driving composite signal or receives the touch sensing composite signal when the OLED touch display panel is in the touch period;
    wherein a gate of the second thin film transistor receives a second level signal, a source of the second thin film transistor is shorted to the gate of the first thin film transistor, and a drain of the second thin film transistor is shorted to the drain of the first thin film transistor; and
    wherein the first level signal and the second level signal are reciprocal signals.

4. The OLED touch display panel as claimed in claim 1, wherein the time division multiplexing circuit unit comprises a first thin film transistor and a second thin film transistor;
    wherein a gate of the first thin film transistor transmits and receives a touch composite signal synthesized by a first level signal and a touch signal, a source of the first thin film transistor receives a power voltage signal or a reset voltage signal of the voltage signal, and a drain of the first thin film transistor outputs the power voltage signal or the reset voltage signal when the OLED touch display panel is in the display period, the drain further transmits and receives the touch composite signal when the OLED touch display panel is in the touch period;
    wherein a gate of the second thin film transistor receives a second level signal, a source of the second thin film transistor is shorted to the gate of the first thin film transistor, and a drain of the second thin film transistor is shorted to the drain of the first thin film transistor; and
    wherein the first level signal and the second level signal are reciprocal signals.

5. The OLED touch display panel as claimed in claim 1, wherein the time division multiplexing circuit unit comprises a first thin film transistor, a second thin film transistor, and a third thin film transistor;
    wherein a gate of the first thin film transistor receives a first level signal, a source of the first thin film transistor receives a power voltage signal or a reset voltage signal of the voltage signal, and a drain of the first thin film transistor outputs the power voltage signal or the reset voltage signal when the OLED touch display panel is in the display period, the drain further outputs the touch driving composite signal or receives the touch sensing composite signal when the OLED touch display panel is in the touch period;
    wherein a gate of the second thin film transistor receives a second level signal, a source of the second thin film transistor is shorted to the gate of the first thin film transistor, and a drain of the second thin film transistor is shorted to the drain of the first thin film transistor;

wherein a gate of the third thin film transistor is shorted to the gate of the second thin film transistor, a source of the third thin film transistor receives the touch driving signal or outputs the touch sensing signal, and a drain of the third thin film transistor is shorted to the gate of the first thin film transistor; and wherein the first level signal and the second level signal are reciprocal signals.

6. The OLED touch display panel as claimed in claim 1, wherein the time division multiplexing circuit unit comprises a first thin film transistor, a second thin film transistor, and a third thin film transistor;

wherein a gate of the first thin film transistor receives a first level signal, a source of the first thin film transistor receives a power voltage signal or a reset voltage signal of the voltage signal, and a drain of the first thin film transistor outputs the power voltage signal or the reset voltage signal when the OLED touch display panel is in the display period, the drain further outputs the touch driving composite signal or receives the touch sensing composite signal when the OLED touch display panel is in the touch period;

wherein a gate of the second thin film transistor receives a second level signal, a source of the second thin film transistor is shorted to the gate of the first thin film transistor, and a drain of the second thin film transistor is shorted to the drain of the first thin film transistor;

wherein a gate of the third thin film transistor is shorted to the gate of the second thin film transistor, a source of the third thin film transistor transmits and receives a touch signal, and a drain of the third thin film transistor is shorted to the gate of the first thin film transistor; and wherein the first level signal and the second level signal are reciprocal signals.

7. The OLED touch display panel as claimed in claim 1, wherein the time division multiplexing circuit unit comprises a first thin film transistor and a second thin film transistor;

wherein a gate of the first thin film transistor receives a first level signal, a source of the first thin film transistor receives the touch driving signal or outputs the touch sensing signal, and a drain of the first thin film transistor outputs a power voltage signal or a reset voltage signal of the voltage signal when the OLED touch display panel is in the display period, the drain further outputs the touch driving signal or receives the touch sensing signal when the OLED touch display panel is in the touch period;

wherein a gate of the second thin film transistor receives a second level signal, a source of the second thin film transistor receives the power voltage signal or the reset voltage signal, and a drain of the second thin film transistor is shorted to the drain of the first thin film transistor; and wherein the first level signal and the second level signal are reciprocal signals.

8. An organic light-emitting diode (OLED) touch display panel, comprising:

a source and drain layer and a pixel defining layer disposed on an array substrate, and sensor pads embedded in the pixel defining layer;

wherein in a display area of the OLED touch display panel, voltage signal traces of the source and drain layer are multiplexed as touch signal traces of the sensor pads;

wherein when the OLED touch display panel is in a display period, a display driving module inputs a voltage signal to the OLED touch display panel through the voltage signal traces to provide the voltage signal to a pixel circuit of the OLED touch display panel; and wherein when the OLED touch display panel is in a touch period, a touch module inputs a touch driving signal or a touch driving composite signal to the OLED touch display panel through the touch signal traces, and the touch module receives a touch sensing signal or a touch sensing composite signal generated by the sensor pads of the OLED touch display panel;

wherein outside the display area of the OLED touch display panel, each of the input ends of the touch signal traces is provided with a time division multiplexing circuit unit;

wherein when the OLED touch display panel is in the display period, the display driving module inputs the voltage signal to the OLED touch display panel through the time division multiplexing circuit unit; and wherein when the OLED touch display panel is in the touch period, the touch module inputs the touch driving signal or the touch driving composite signal to the OLED touch display panel through the time division multiplexing circuit unit, and the touch module receives the touch sensing signal or the touch sensing composite signal generated by the sensor pads of the OLED touch display panel.

9. The OLED touch display panel as claimed in claim 8, wherein a way of the voltage signal traces of the source and drain layer being multiplexed as the touch signal traces of the sensor pads is one of following ways:

power voltage signal traces of the voltage signal traces are multiplexed as touch driving signal traces of the touch signal traces, and reset voltage signal traces of the voltage signal traces are multiplexed as touch sensing signal traces of the touch signal traces; or the power voltage signal traces of the voltage signal traces are multiplexed as the touch sensing signal traces of the touch signal traces, and the reset voltage signal traces of the voltage signal traces are multiplexed as the touch driving signal traces of the touch signal traces; or the power voltage signal traces or reset voltage signal traces of the voltage signal traces are multiplexed as the touch signal traces.

10. The OLED touch display panel as claimed in claim 8, wherein the OLED touch display panel is a mutual-capacitance touch display panel, in the display area of the OLED touch display panel, the voltage signal traces are divided according to sizes of the sensor pads, and sensor driving pads of the sensor pads in a same row are connected in series, and touch sensor pads of the sensor pads in a same column are connected in series.

11. The OLED touch display panel as claimed in claim 8, wherein the time division multiplexing circuit unit comprises a first thin film transistor and a second thin film transistor;

wherein a gate of the first thin film transistor receives the touch driving composite signal synthesized by a first level signal and the touch driving signal, or the touch sensing composite signal synthesized by the first level signal and the touch sensing signal, a source of the first thin film transistor receives a power voltage signal or a reset voltage signal of the voltage signal, and a drain of the first thin film transistor outputs the power voltage signal or the reset voltage signal when the OLED touch display panel is in the display period, the drain further outputs the touch driving composite signal or receives the touch sensing composite signal when the OLED touch display panel is in the touch period;

wherein a gate of the second thin film transistor receives a second level signal, a source of the second thin film transistor is shorted to the gate of the first thin film transistor, and a drain of the second thin film transistor is shorted to the drain of the first thin film transistor; and wherein the first level signal and the second level signal are reciprocal signals.

12. The OLED touch display panel as claimed in claim 8, wherein the time division multiplexing circuit unit comprises a first thin film transistor and a second thin film transistor;

wherein a gate of the first thin film transistor transmits and receives a touch composite signal synthesized by a first level signal and a touch signal, a source of the first thin film transistor receives a power voltage signal or a reset voltage signal of the voltage signal, and a drain of the first thin film transistor outputs the power voltage signal or the reset voltage signal when the OLED touch display panel is in the display period, the drain further transmits and receives the touch composite signal when the OLED touch display panel is in the touch period;

wherein a gate of the second thin film transistor receives a second level signal, a source of the second thin film transistor is shorted to the gate of the first thin film transistor, and a drain of the second thin film transistor is shorted to the drain of the first thin film transistor; and wherein the first level signal and the second level signal are reciprocal signals.

13. The OLED touch display panel as claimed in claim 8, wherein the time division multiplexing circuit unit comprises a first thin film transistor, a second thin film transistor, and a third thin film transistor;

wherein a gate of the first thin film transistor receives a first level signal, a source of the first thin film transistor receives a power voltage signal or a reset voltage signal of the voltage signal, and a drain of the first thin film transistor outputs the power voltage signal or the reset voltage signal when the OLED touch display panel is in the display period, the drain further outputs the touch driving composite signal or receives the touch sensing composite signal when the OLED touch display panel is in the touch period;

wherein a gate of the second thin film transistor receives a second level signal, a source of the second thin film transistor is shorted to the gate of the first thin film transistor, and a drain of the second thin film transistor is shorted to the drain of the first thin film transistor;

wherein a gate of the third thin film transistor is shorted to the gate of the second thin film transistor, a source of the third thin film transistor receives the touch driving signal or outputs the touch sensing signal, and a drain of the third thin film transistor is shorted to the gate of the first thin film transistor; and wherein the first level signal and the second level signal are reciprocal signals.

14. The OLED touch display panel as claimed in claim 8, wherein the time division multiplexing circuit unit comprises a first thin film transistor, a second thin film transistor, and a third thin film transistor;

wherein a gate of the first thin film transistor receives a first level signal, a source of the first thin film transistor receives a power voltage signal or a reset voltage signal of the voltage signal, and a drain of the first thin film transistor outputs the power voltage signal or the reset voltage signal when the OLED touch display panel is in the display period, the drain further outputs the touch driving composite signal or receives the touch sensing composite signal when the OLED touch display panel is in the touch period;

wherein a gate of the second thin film transistor receives a second level signal, a source of the second thin film transistor is shorted to the gate of the first thin film transistor, and a drain of the second thin film transistor is shorted to the drain of the first thin film transistor;

wherein a gate of the third thin film transistor is shorted to the gate of the second thin film transistor, a source of the third thin film transistor transmits and receives a touch signal, and a drain of the third thin film transistor is shorted to the gate of the first thin film transistor; and wherein the first level signal and the second level signal are reciprocal signals.

15. The OLED touch display panel as claimed in claim 8, wherein the time division multiplexing circuit unit comprises a first thin film transistor and a second thin film transistor;

wherein a gate of the first thin film transistor receives a first level signal, a source of the first thin film transistor receives the touch driving signal or outputs the touch sensing signal, and a drain of the first thin film transistor outputs a power voltage signal or a reset voltage signal of the voltage signal when the OLED touch display panel is in the display period, the drain further outputs the touch driving signal or receives the touch sensing signal when the OLED touch display panel is in the touch period;

wherein a gate of the second thin film transistor receives a second level signal, a source of the second thin film transistor receives the power voltage signal or the reset voltage signal, and a drain of the second thin film transistor is shorted to the drain of the first thin film transistor; and wherein the first level signal and the second level signal are reciprocal signals.

16. The OLED touch display panel as claimed in claim 8, wherein the display driving module and the touch module are integrated in a chip.

17. A method for driving time division multiplexing of an organic light-emitting diode (OLED) touch display panel, comprising:

wherein when the OLED touch display panel is in a display period, a display driving module inputs a voltage signal to the OLED touch display panel through voltage signal traces in a display area of the OLED touch display panel to provide the voltage signal to a corresponding pixel circuit of the OLED touch display panel;

wherein when the OLED touch display panel is in a touch period, the voltage signal traces are multiplexed as touch signal traces, a touch module inputs a touch driving signal or a touch driving composite signal to the OLED touch display panel through the touch signal traces, and the touch module receives a touch sensing signal or a touch sensing composite signal generated by corresponding sensor pads of the OLED touch display panel;

wherein outside the display area of the OLED touch display panel, each of the input ends of the touch signal traces is provided with a time division multiplexing circuit unit;

wherein when the touch display panel is in the display period, the display driving module inputs the voltage signal to the OLED touch display panel through the time division multiplexing circuit unit; and wherein when the OLED touch display panel is in the touch period, the touch module inputs the touch driving signal or the touch driving composite signal to the OLED touch display panel through the time division multiplexing circuit unit, and the touch module receives the touch sensing signal or the touch sensing composite signal generated by the corresponding sensor pads of the OLED touch display panel.

18. The method as claimed in claim 17, wherein a way of the voltage signal traces of the source and drain layer being multiplexed as the touch signal traces of the sensor pads is one of following ways:

power voltage signal traces of the voltage signal traces are multiplexed as touch driving signal traces of the touch signal traces, and reset voltage signal traces of the voltage signal traces are multiplexed as touch sensing signal traces of the touch signal traces; or the power voltage signal traces of the voltage signal traces are multiplexed as the touch sensing signal traces of the touch signal traces, and the reset voltage signal traces of the voltage signal traces are multiplexed as the touch driving signal traces of the touch signal traces; or the power voltage signal traces or reset voltage signal traces of the voltage signal traces are multiplexed as the touch signal traces.

\* \* \* \* \*